United States Patent
Ananth et al.

(10) Patent No.: US 7,331,019 B2
(45) Date of Patent: Feb. 12, 2008

(54) SYSTEM AND METHOD FOR REAL-TIME CONFIGURABLE MONITORING AND MANAGEMENT OF TASK PERFORMANCE SYSTEMS

(75) Inventors: Viswanath Ananth, Norristown, PA (US); Ananthakrishnan Surianarayanan, Lansdale, PA (US)

(73) Assignee: Pathway Technologies, Inc., Ambler, PA (US)

( * ) Notice: Subject to any disclaimer, the term of this patent is extended or adjusted under 35 U.S.C. 154(b) by 365 days.

(21) Appl. No.: 10/912,649

(22) Filed: Aug. 4, 2004

(65) Prior Publication Data

US 2006/0031787 A1    Feb. 9, 2006

Related U.S. Application Data

(63) Continuation-in-part of application No. 10/911,161, filed on Aug. 2, 2004.

(60) Provisional application No. 60/492,771, filed on Aug. 2, 2003.

(51) Int. Cl.
*G06F 3/00* (2006.01)
(52) U.S. Cl. .................... 715/771; 715/763
(58) Field of Classification Search .............. 715/967, 715/763, 835, 764, 771, 810; 717/105, 109; 718/102
See application file for complete search history.

(56) References Cited

U.S. PATENT DOCUMENTS

| | | | | |
|---|---|---|---|---|
| 6,229,538 B1 * | 5/2001 | McIntyre et al. | ........... | 715/734 |
| 6,330,008 B1 * | 12/2001 | Razdow et al. | ............. | 715/772 |
| 6,642,942 B1 * | 11/2003 | Crook | ......................... | 715/744 |
| 6,868,412 B2 * | 3/2005 | Gatehouse et al. | ........... | 706/62 |
| 7,143,100 B2 * | 11/2006 | Carlson et al. | ............. | 707/101 |
| 2002/0083413 A1 * | 6/2002 | Kodosky et al. | ............ | 717/109 |
| 2002/0126151 A1 * | 9/2002 | Chandhoke et al. | ........ | 345/771 |
| 2005/0015732 A1 * | 1/2005 | Vedula et al. | ............... | 715/805 |

* cited by examiner

*Primary Examiner*—Kieu D. Vu
(74) *Attorney, Agent, or Firm*—Edward Etkin, Esq

(57) ABSTRACT

The system and method of the present invention enable the user to build and/or use an interactive visual instrument panel for monitoring and/or managing one or more target systems locally or remotely in real-time, with the instrument panel being configured based on the user-defined requirements and based on the attributes of the target system(s) being monitored and/or managed. In one embodiment of the present invention a novel data handling system is provided for ensuring that the target system is able to continuously transmit real-time data without any data loss and without interrupting its operation.

36 Claims, 24 Drawing Sheets

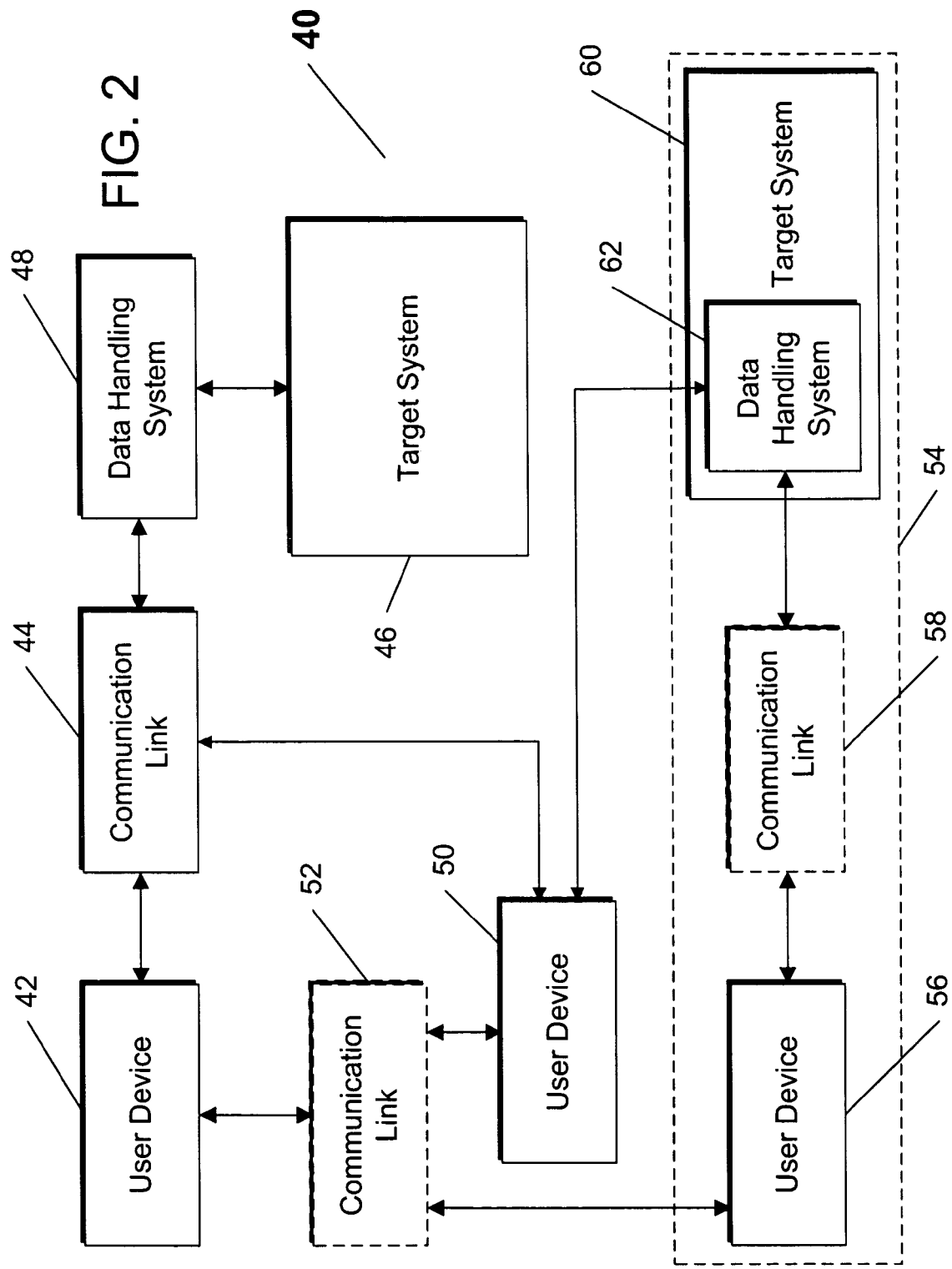

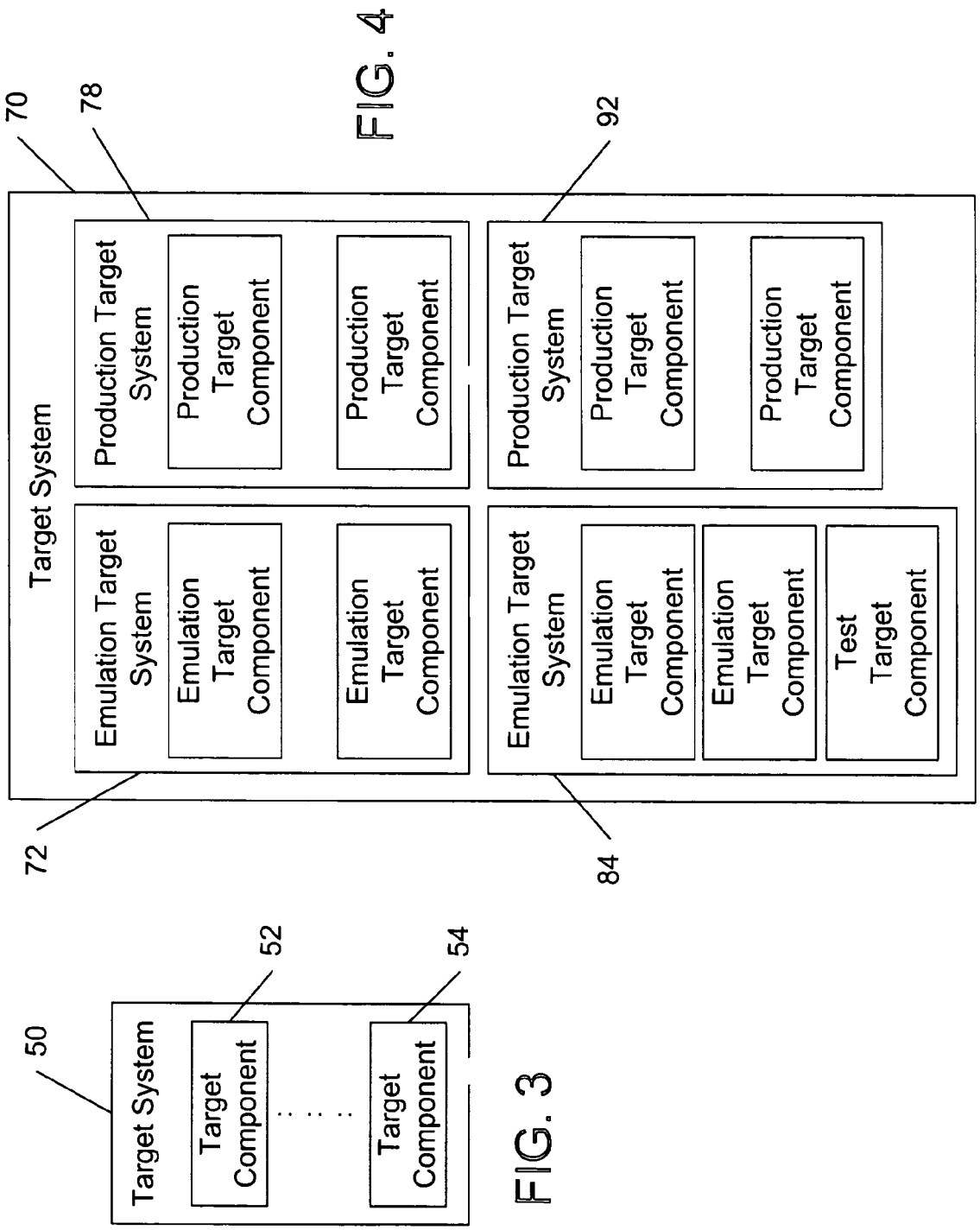

(Exemplary)

FIG. 16 (Exemplary)

(Exemplary)

FIG. 18 (Exemplary)

FIG. 19 (Exemplary)

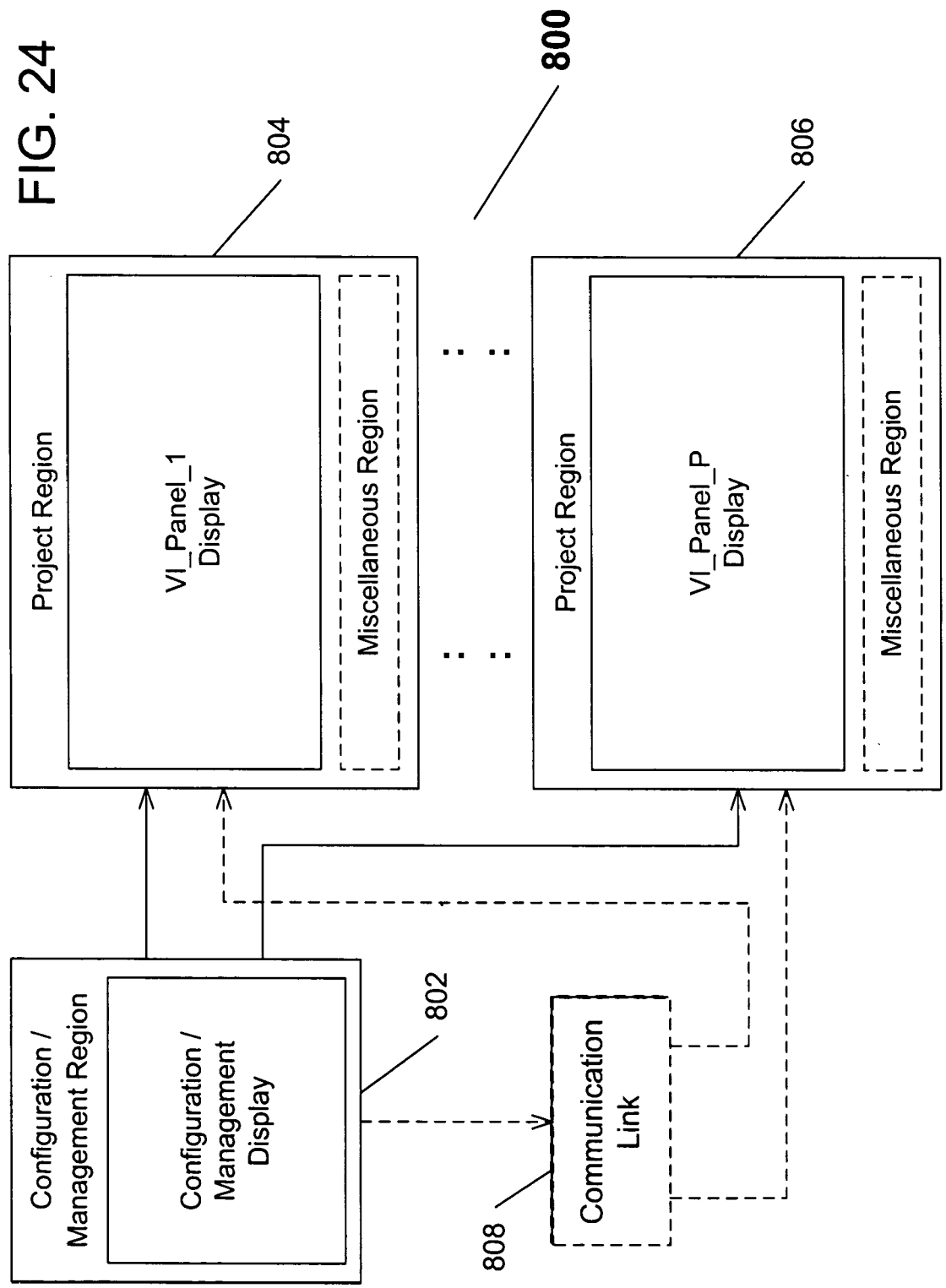

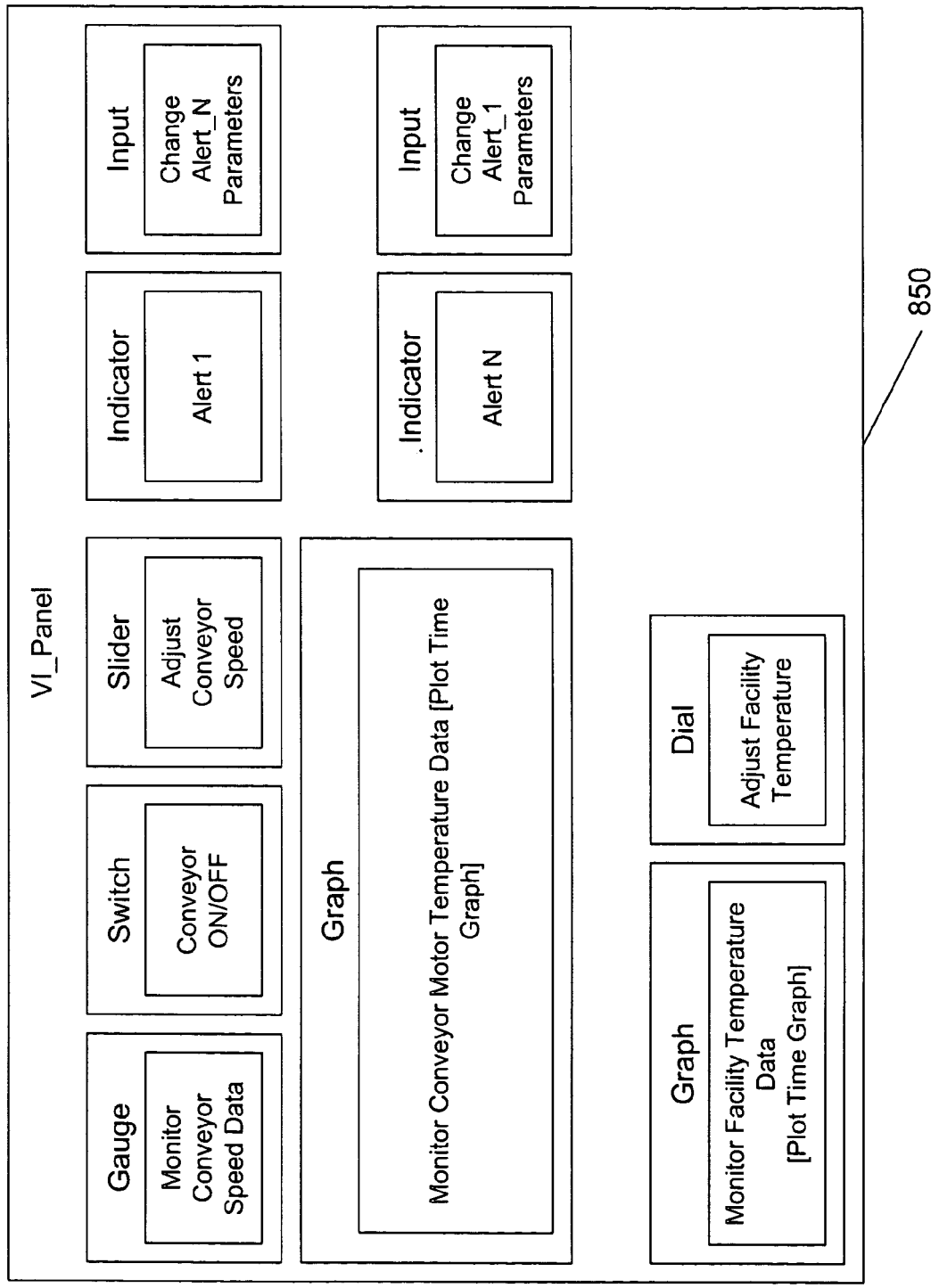
FIG. 25 (Exemplary)

SYSTEM AND METHOD FOR REAL-TIME CONFIGURABLE MONITORING AND MANAGEMENT OF TASK PERFORMANCE SYSTEMS

CROSS REFERENCE TO RELATED APPLICATIONS

The present patent application is a continuation-in-part (CIP) of the commonly assigned U.S. patent application Ser. No. 10/911,161, entitled: "SYSTEM AND METHOD FOR RAPID DESIGN, PROTOTYPING, AND IMPLEMENTATION OF DISTRIBUTED SCALABLE ARCHITECTURE FOR TASK CONTROL AND AUTOMATION", filed Aug. 2, 2004, which in turns claims priority from the U.S. Provisional Patent provisional patent application Ser. No. 60/492,771 entitled "SYSTEM AND METHOD FOR RAPID DESIGN, PROTOTYPING AND IMPLEMENTATION OF DISTRIBUTED SCALABLE ARCHITECTURE FOR TASK CONTROL AND AUTOMATION" filed Aug. 2, 2003.

FIELD OF THE INVENTION

The present invention relates generally to a data processing system and method for enabling real-time access to and control of operations of a task performance system or device, and more particularly for an interactive user-configurable scalable data processing system with a user-customizable interface for real-time remote monitoring and management of one or more task performance systems or devices of virtually any complexity.

BACKGROUND OF THE INVENTION

Traditionally, the process of design, prototyping, and implementation of complex industrial applications (such as manufacturing process control, multi-component devices and (such as manufacturing process control, multi-component devices and other systems or devices), has been an extremely difficult, costly and time consuming task. Typically, this process involved a long iterative, and often empirical, process, of formulating the requirements of the desired system, conceptually planning the system, developing a prototype, writing programs or other code necessary for implementation, testing the implemented prototype and then repeating many of the steps, in most cases including the arduous and frustrating coding of new programs, even when minor changes to the prototype are necessary. In cases of more serious issues, the entire system is often re-designed further consuming a great deal of time and resources. This trial and error approach of system and device design has been a challenge for engineers and designers for years.

Nevertheless, as data processing systems came into increased use in the last several decades, attempts have been made to automate and simplify at least some of the steps involved in system design, prototyping, and implementation, both for design of new systems and for modification, re-engineering and improvement of existing industrial systems. Thus, as data processing (i.e. computer) systems have gained increased utilization in the field of system and device design, a great deal of effort was directed toward providing engineers and system designers with powerful software tools that simplify the difficult goal of designing and modeling a system (e.g., industrial, computer, process control, etc.) or an apparatus (e.g., automobile exhaust system, engine, motor, etc.) in a software environment. The ultimate goal of these tools was to enable the user (e.g., the engineer) to design a software model of the desired system, simulate the model to ensure proper system operation, and hopefully assist the user in implementing the modeled system in real-world devices.

However, even with the aid of currently available powerful software tools, prototyping of a complex system or apparatus which generally requires a distributed architecture for its various operational parameters (such as an industrial process control application), it is a difficult and time consuming process with at least the following steps that must be performed by the user as part of the design to implementation cycle:

1) Design the desired target system functionality;

2) Break down the target system manually into distributed target components requiring slight modification in design, model each component and their connections separately to correspond to a real-world target device or system, and assign a portion of the desired functionality to each component, and establish connections between appropriate components;

3) Write appropriate software code to cause each component to perform their assigned functionality as well as to ensure proper communication and data interchange between various components 3) Simulate the operation of the system, testing and monitoring one component at a time; and 4) Manage the system (i.e., issue commands such as start, stop, record progress or status), one component at a time.

5) If problems occur, repeat one or more of the previous steps until the target system performs acceptably.

Because the key actions for all of the above tasks must be performed manually by the user, even with the assistance of the most powerful currently available design tools, the design-to-implementation cycle in continuous product development industries (such as automotive and aerospace industries), remains undesirably long. In addition, changes to the system architecture or to system components during the prototyping process must be manually propagated through the entire system, thus resulting in a further significant delay and expense. Furthermore, the most frustrating and difficult tasks for the user of previously known system design software tools—the second and third steps shown above—are still an ever-present requirement. Thus, the user must still engage in the manual and time-intensive partitioning of the designed system into multiple components corresponding to various real-world hardware systems and writing a great deal of code each time a change to any aspect of the system must be made (e.g., moving an element of a model to a different partition to relieve the load on a target component), but now utilizing an attractive graphical user interface to do so.

The above issues are due at least in part to the fact that the great deal of the advancements in the system design and modeling tools have been directed to improvements of preliminary system design capabilities, for example to provide users with innovative and easy to use graphical design tools, to enable visual concept-to-design model development, and to otherwise shorten the concept-to-design cycles, to enable improved computerized design simulation. Others directed their research and development to offering improvements and innovations in hardware target components, resulting in relatively inexpensive and powerful embedded system target components that may be utilized to emulate real-world physical components or that may be used as production target components themselves. Accordingly, the area between the two has been largely neglected or ignored.

However, virtually all of the above challenges and problems, and other drawbacks of all previously known design, modeling and prototyping systems have been advantageously remedied by a novel automated rapid design, prototyping, and implementation (hereinafter "IRMM") system, disclosed in a commonly assigned co-pending U.S. Patent Application entitled 'SYSTEM AND METHOD FOR RAPID DESIGN, PROTOTYPING, AND IMPLEMENTATION OF DISTRIBUTED SCALABLE ARCHITECTURE FOR TASK CONTROL AND AUTOMATION', filed concurrently herewith, and hereby incorporated by reference herein in its entirety (hereinafter the "RDPI system") that gives its user the ability to quickly and easily move from a designed visual model of a task control and/or performance system or apparatus, (that may be created with any form of readily available visual design and/or modeling tools, to a real-time interactive prototype model representative of the actual desired real-world system or apparatus (hereinafter "target system"). The user may then utilize the IRMM system to automatically generate and/or assemble any executable instruction modules and necessary support modules based on the prototype model, and then direct the modules to a physical real-world target system, corresponding to the prototype model, to implement the designed task performance system or apparatus for desired utilization.

While the above-incorporated novel IRMM system has numerous advantages over all previously know approaches, it does not in itself provide a solution to one of the greatest challenges facing not only the developers of task performance systems and devices, but also those who operate, maintain, troubleshoot and work with existing complex task performance systems—the ability to control and monitor (locally and/or remotely) the operation of an entire remote task performance system (whether a system in development or an existing working system) or a device, remotely in real time without any loss of system-related information by the monitoring/managing user. The secondary challenge of providing an easy to use customizable interface for simultaneously monitoring and managing various aspects of a remote system during its operation has likewise gone substantially unanswered.

There have been many techniques and attempted solutions that attempted to provide these capabilities, especially as part of a design and/or prototyping process. For example the U.S. Pat. No. 6,763,395 to Austin, claims to provide the capability of viewing live data generated during operation of a remote instrumentation or control system. However, the Austin system provides that capability only for viewing the live feed for one component of the remote system at a time. Most other approaches suffer from similar limitations.

Furthermore, the majority of existing system design and development tools are generally limited to utilization in the field of embedded system or industrial process control design and thus even their limited "one-at-a-time" remote monitoring/management features cannot be readily used for monitoring in other forms of task performance systems or devices.

One of the reasons for the above challenges, is that most types of systems from which real-time data must be gathered, when used in conjunction with conventional monitoring/management tools, must stop recording data while they collect and transmit data that has been recently collected. In addition, most previously known monitoring/management solutions are concerned with the user working with a single task performance system, with only complex, expensive and proprietary tools being capable of simultaneously working with many systems. Yet another problem faced by previously know systems is that certain task performance systems have limited capacity to continuously record data without interruption, and require significant modification or enhancement to enable even short term real-time data collection.

Finally, the design of graphical user interfaces for system monitoring and control using currently available tools is still a relatively arduous process, not as much in terms of designing the graphical portions of GUIs, but in building GUIs to monitor/manage specific systems. This may be problematic in system development applications where monitoring/management requirements can change quickly, necessitating constant time-consuming GUI re-design.

It would thus be desirable to provide a system and method for enabling a user to quickly and easily generate a customizable GUI for monitoring and/or management of a task performance system based only on the minimum data representative thereof. It would also be desirable to provide a system and method that may be used as a monitoring and/or management GUI design tool by itself or in conjunction with existing visual system design tools for rapid and inexpensive design, prototyping, re-design, scaling, modification, and/or testing of task performance systems. It would further be desirable to provide a system and method for enabling real-time transfer of data from a task performance system without any loss of data.

BRIEF DESCRIPTION OF THE DRAWINGS

In the drawings, wherein like reference characters denote corresponding or similar elements throughout the various figures:

FIG. 2 shows a block diagram of an exemplary embodiment of an IRMM network that includes two or more IRMM systems of FIG. 1 to each execute one or more novel processes in accordance with the present invention using information based on one or more previously designed target system implementation models;

FIGS. 3 and 4 show diagrams representative of exemplary embodiments of a target system connected to the IRMM system of FIG. 1;

FIGS. 21-24 show a various exemplary embodiments of visual instrument panel GUIs that may be designed and built using the IRMM system of FIG. 1 performing the process of FIGS. 9-11; and FIG. 25 shows an exemplary visual instrument panel GUIs created for use with the exemplary previously designed target system implementation model of FIG. 15.

SUMMARY OF THE INVENTION

Figure 1:
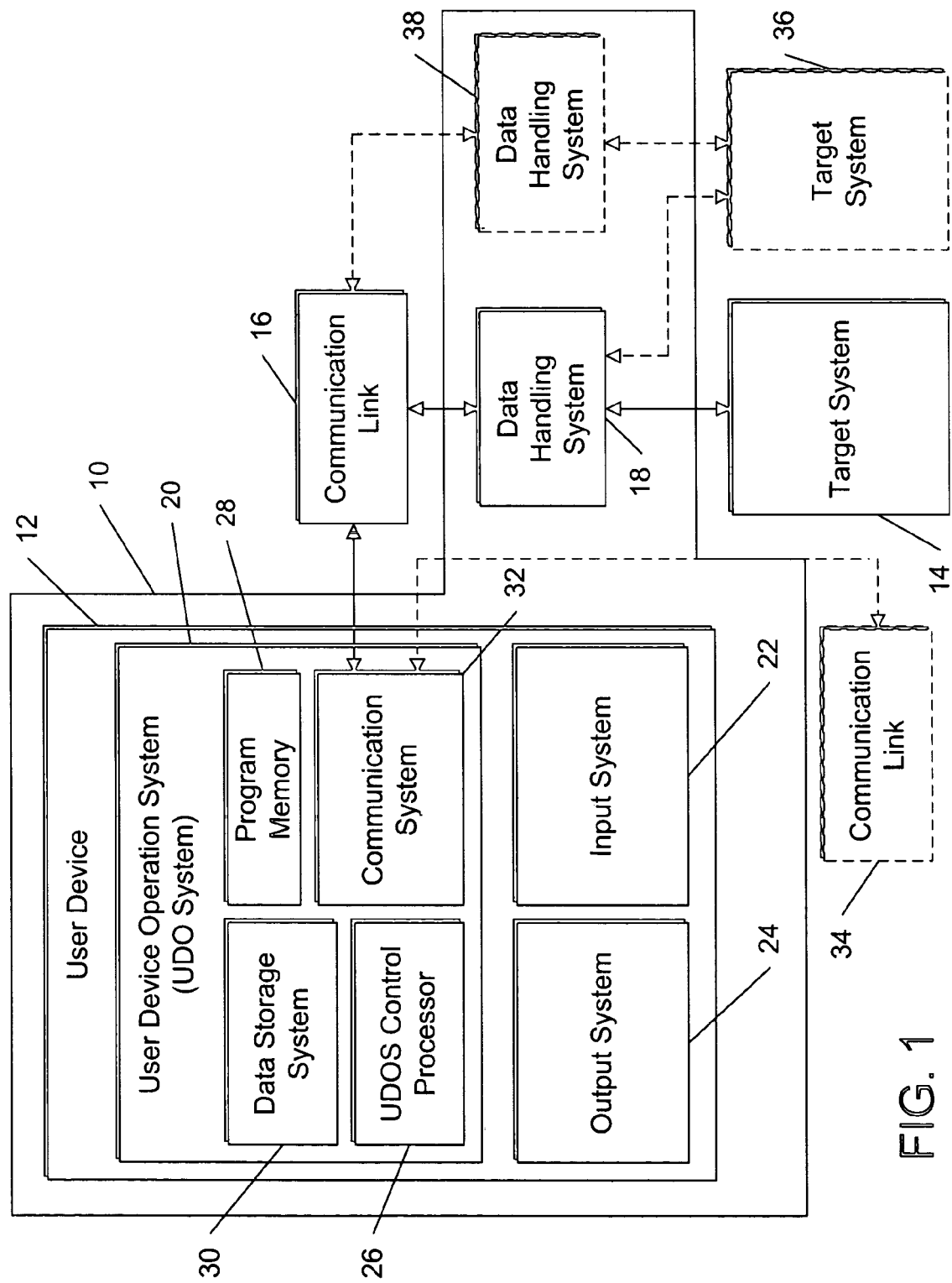
FIG. 1 shows a block diagram of an exemplary embodiment of the interactive real-time monitoring/management (IRMM) system that executes one or more novel processes in accordance with the present invention using information based on a previously designed target system implementation model.

The present invention is directed to a system and method for enabling a user to build and/or utilize an interactive visual instrument panel, implemented on any device supplied with a graphical user interface (GUI), for monitoring and/or managing one or more target systems locally or remotely in real-time, with the instrument panel being configured based on the user-defined requirements and based on the attributes of the target system(s) being monitored and/or managed. In one embodiment of the present invention a novel data handling system is provided for ensuring that the target system is able to continuously transmit real-time data without any data loss and without interrupting its operation.

In summary, the inventive system delivers the above functionality via a user device (that may range in features and other aspects from a pocket computer to a network of powerful computers) that interactively executes one or more novel processes in response to user commands that may be issued through the system's GUI, and, when necessary uses one or more data handling systems to ensure reliable transmission of real-time data from the target system(s).

Advantageously, the inventive processes performed by the system of the present invention, can be performed using only a simplified representation of the attributes of the target system(s) to me monitored/managed. Thus, the inventive system may be used with data extracted from any visual system model that may be created with any form of visual design and/or modeling tools. While the inventive system may be readily implemented in a stand-alone configuration independent of any other design or modeling tools or environments, as a matter of design choice, it may be utilized in conjunction with existing visual system design tools for rapid and inexpensive design, prototyping, re-design, scaling, modification, and/or testing of task performance systems. This approach is very attractive because the user is able utilize an available and familiar graphical user interface and controls of the initial design system and at the same time use all of the novel features and capabilities provided in accordance with the present invention.

In accordance with the present invention, the inventive system provides an novel interactive GUI with novel tools and functionality that enable the user to readily design an interactive, an easily reconfigurable visual instrument panel for monitoring and/or management of one or more remote target systems or devices or of specific components thereof. Alternate embodiments of the inventive interface, but are not limited to multiple display configurations for collective monitoring of one or more target systems by geographically dispersed users, or configuration of specific instrument panels for benchmarking multiple variants of the same system at once.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF PREFERRED EMBODIMENTS

The system and method of the present invention remedy the disadvantages of all previously known tools, solutions, and approaches for monitoring and management of task performance systems and devices by enabling a user to build and/or utilize an interactive visual instrument panel, implemented on any device supplied with a graphical user interface (GUI), for monitoring and/or managing one or more target systems locally or remotely in real-time, with the instrument panel being configured based on the user-defined requirements and based on the attributes of the target system (s) being monitored and/or managed. In one embodiment of the present invention a novel data handling system is provided for ensuring that the target system is able to continuously transmit real-time data without any data loss and without interrupting its operation. In addition, the inventive interactive real-time monitoring and management (hereinafter "IRMM") system gives its user the ability to monitor and/or manage the operation of any task performance system or device in real time and without any loss of data, by providing a novel data handling system that may be a separate device proximal to the target system or that may be incorporated therein In particular, the inventive IRMM system provides many significant advantages in technology areas with continuous or long-term product development cycles, such as in the automotive industry where there is a great need to monitor and manage prototype systems at each stage of development and where automated or semi-automated manufacturing facilities are in widespread use. In addition, certain technology areas would greatly benefit on from virtually all of the functionality and features offered by the novel IRMM system both during system development and also during subsequent usage. For example, the aerospace industry engages in a great deal of constant cutting edge development of new technologies, where the IRMM system could be advantageously utilized. However, with increasing utilization of autonomous and semi-autonomous systems in military and civilian applications (such as remote drone vehicles, robots, satellites, and other unmanned systems), the IRMM system can also provide an enormous advantage in enabling operators and engineers to monitor and manage these systems during their intended utilization in real time, and though completely customizable interactive interfaces—whether from a single location or from geographically dispersed sites. Moreover, with the assistance of the IRMM system's novel completely modular user-configurable interface design tool, a single user can monitor and manage one or more aspects of multiple remote systems, or multiple users can monitor and manage different aspects (or subsystems) of a large or complex system.

While the inventive IRMM system is described below as advantageously configured, by way of example, for industrial process (or process control) design and for distributed embedded systems, it should be understood to one skilled in the art, that, as noted above, the IRMM system may be readily and advantageously utilized for prototyping and implementation of any type of system or device, including, but not limited to process control systems, automated industrial systems (fabrication, packaging, sorting, etc), distributed electromechanical systems, embedded systems of various functionalities (control and otherwise), electrical devices, mechanical devices, hybrid systems (for example a modern internal combustion engine), and distributed computational systems, for example, for massive computational processes such as military, research, or meteorological applications, without departing from the spirit of the invention as a matter of necessity or design choice.

Before describing the inventive IRMM system in greater detail, it would be helpful to provide an overview of the various types of target systems that may be designed and implemented in accordance with the present invention, and of the various target components that may be utilized therein. It should first be noted that for the purpose of convenience, the terms "system" and "device" will hereinafter be used interchangeably, and thus will be individually and collectively referred to as a "target system"—the inventive IRMM is equally applicable both to devices (for example, a motor) as well as to systems of any complexity (for example, ranging from an exhaust system to a manufacturing plant control system). Furthermore, for the purpose of the present invention the term "data" as used herein, refers to any type of information, from measurement readings (such as temperature, gain, voltage, current, or speed), to signals of various types, as well as to audio and video image information. The term "data stream" refers to a data that is continually generated (for example the torque measurement of a working engine, or a video being sent from a camera). The term "managing" refers broadly to any type of commands or instructions issued to a target system, for example to cause it (or one or more of its components) to perform one or more actions (control, diagnostic, or normal operations) or to return requested data.

The simplest target system may include as little as a single target component, but a more complex target system may include a far greater number of target components, as a matter of design choice or necessity. While an actual real-world target system or device may have many physical components, such as a housing, wires, and similar features, the inventive IRMM system is only concerned with components of the target system that are capable of performing one or more actions in response to internal instructions or received commands and/or that are capable of generating or collecting data. The target components themselves can vary from simple to complex.

Referring now to FIG. 1, a first embodiment of the inventive IRMM system 10 is shown. The key novel features of the IRMM system 10 are embodied in the inventive processes, described in greater detail below in connection with FIGS. 6-14, that may be implemented in whole or in part as one or more executable programs, embedded functions, or other form of data processing tasks by one or more components thereof. These inventive processes enable the user to fully utilize the previously summarized novel and advantageous features of the IRMM system 10, as well as take advantage of numerous other novel features and options described below in connection with various figures.

The IRMM system 10 includes a user device 12 for enabling the user to build and/or use an interactive visual instrument panel for monitoring and/or managing one or more target systems, with the instrument panel being configured based on the user-defined requirements and based on the attributes of the target system(s) being monitored and/or managed.

The user device 12 may be any interactive device or system with a graphical user interface (GUI) that is capable of bidirectional communication with one or more target systems, so that the user is able to control and/or manage any target system communicating with the device 12. Thus, at a minimum, the user device 12 is preferably capable of:

providing the user with an interactive visual interface,
enabling the user to interact with and manipulate various displayed visual elements,
performing one or more inventive processes and any required associated operations,
providing the user with the ability to control its operation and the inventive processes, and
communicating with one or more target systems to issue instructions to the target system, and to receive data therefrom.

For example, the user device 12 may be any computer system with at least the above-listed capabilities, including, but not limited to: a small computer (e.g. a pocket computer or equivalent), a portable computer (e.g., a notebook or touchpanel computer, or equivalent), a workstation (or equivalent), or a terminal of a local or remote computer system. As a matter of design choice, the user device 12, may be capable of performing other tasks, in addition to those that are required by the IRMM system 10, or for example, it may be a dedicated or proprietary system optimized for meeting the IRMM system 10 demands. Optionally, the user device 12 may be implemented as two or more interconnected computer systems, to either distribute the task load imposed by the IRMM system 10 or to allow two or more users to collaborate on the system management and/or monitoring process.

The user device 12 includes the following elements (that may be separate components connected to one or more other components, or that may be integrated with one or more of the other components as a single unit): a user device operation (UDO) system 20 for controlling the various components of the user device 12, performing one or more inventive processes, executing other programs, storing data, and equivalent tasks, an input system 22 for receiving instructions and information from the user, and an output system 24 for conveying information to the user.

The UDO system 20 is preferably a main computer assembly or unit that may include, but is not limited to:

a UDOS control processor 26 and associated hardware for running an operating system, for executing application programs (including for example, a least portion of the IRMM system 10 inventive processes in from of executable application programs), and otherwise controlling operation of all other components of the user device 12;

a program memory 28, such as random access memory (RAM) or equivalent, for temporarily storing data, program instructions and variables during the execution of application programs by the UDOS control processor 26;

a data storage system 30, such as flash memory, optical, magnetic, or magneto-optical drives, or equivalent, for long term storage of data and application programs (optionally if the program memory 28 is of sufficient size and reliability, the functions of the data storage system 30 may be incorporated therein; and a communication system 32, such as a modem, a communication network interface device, or equivalent, for transmitting to, and receiving data from another system through a communication link (e.g. a network, a direct line, etc.).

The output system 24 preferably includes a display system for displaying visual information to the user, such as one or more monitors, an optional sound system, such as speakers or headphones, and an optional hard copy system, such as a printer, or equivalent.

The input system 22 preferably includes at least one data input device for enabling the user to interact with the user device 12. For example, the input system 22 includes one or more of the following input devices: a keyboard, a selection device (i.e. mouse, trackball, or touchpad), an optionally a voice recognition device. Optionally, the input system 22 may include a security system (for example, a biometric device such as a fingerprint scanner, face recognition device, or a retinal scanner) for receiving identity verification data from the user prior to allowing the user to utilize the IRMM system 10. For example, it may be a biometric device such as a fingerprint scanner, face recognition device, or a retinal scanner.

It should be understood that the choice of a specific type or configuration of the user device 12, and its types and features of its various components, is determined by requirements that depend on the purposes for which the IRMM system 10 will be used (e.g., the complexity of the target system(s) being managed/monitored, etc.)

At a certain point in its operation, when its management/monitoring functions are ready to be utilized, the IRMM system 10 may be linked to a target system 14. The target system 14 may be any target system that has been configured to correspond to a previously created target system implementation model, or for which a representative target system implementation model has been developed. Various exemplary types and configurations of target systems are described above, and several exemplary target system configurations are discussed below in connection with FIGS. 2 and 3.

A target system implementation model (TSI_Model is a virtual representation of the target system, its various components, their interconnections, as well as all performable actions, data outputs, and similar information, and may include one or more graphical, mathematical, programming, database and text components elements. While many different tools exist to create such models, the most superior approach is disclosed, and discussed in great detail, in the above-incorporated RDPI system patent application. The RDPI system enables a user to quickly and easily create an operational system model (representative of a desirable system model partitioned into individual model elements and/or model element groups (i.e., "partitions") intended for assignment to particular target components (PS_MODEL), as well as the necessary communication links therebetween), and to create a target system model in which the partitions are assigned to selected target components for future implementation (TS_MODEL). Together, the PS_MODEL and TS_MODEL are representative of all aspects of a target system that may be monitored and/or managed by the user through the user device 12. Of course any other modeling system or tool that us capable of generating a TSI_Model may be used as a matter of choice, without departing from the spirit of the invention. The specific interaction between the TSI_Model and the IRMM device 12 is discussed below in connection with FIGS. 5 and 12-15.

The user device 12 communicates with the target system 14 via a communication link 16, which may be any communication link that enables bi-directional transmission of information. Examples of communication links 16 that may readily be utilized include, but are not limited to, one or more of the following: direct connection, the Internet, local area network (LAN), wide area network (WAN), Intranet, dial-up network, and wireless network (e.g., infrared, cellular, satellite, radio, or a network using any other wireless communication method). Thus, in practice, the user device 12 and the target system 14 may be connected to one another directly (for example if the target system 14 is at the user's location, or vice versa), or they be geographically separated, as long as they can communicate with one another.

As discussed in great detail above, one of the key challenges in monitoring/management of target system is the need for true real-time data collection from the target system. While simple target systems may not generate a great deal of data, in most cases the reverse is true. Thus, the novel IRMM system 10 preferably includes a data handling system 18 for enabling real time guaranteed data transmission from the target system 14. In most real-time data stream transmissions, there are occasional areas of data loss or drops. However, guaranteed data transmission is crucial because when dealing with management/monitoring of industrial, aerospace, military or equivalent systems, any data loss can be disastrous. To avoid data loss it is important to enable the target system 14 to continually transmit data while continuing its operations, rather than, as with previously known approaches, engage in a "collect/stop/transmit/collect . . . " cycle. The data handling system 18 should thus be provided as part of, or as an external interface to, the target system 14 to ensure guaranteed real-time communication from the target system 14 without any loss of data even during monitoring/management of a complex data system with a massive data output. While data handling system 18 may be any data management system capable of above-described functionality, a preferred embodiment of a novel data handling system is described below in connection with FIGS. 6-10.

Figure 6:
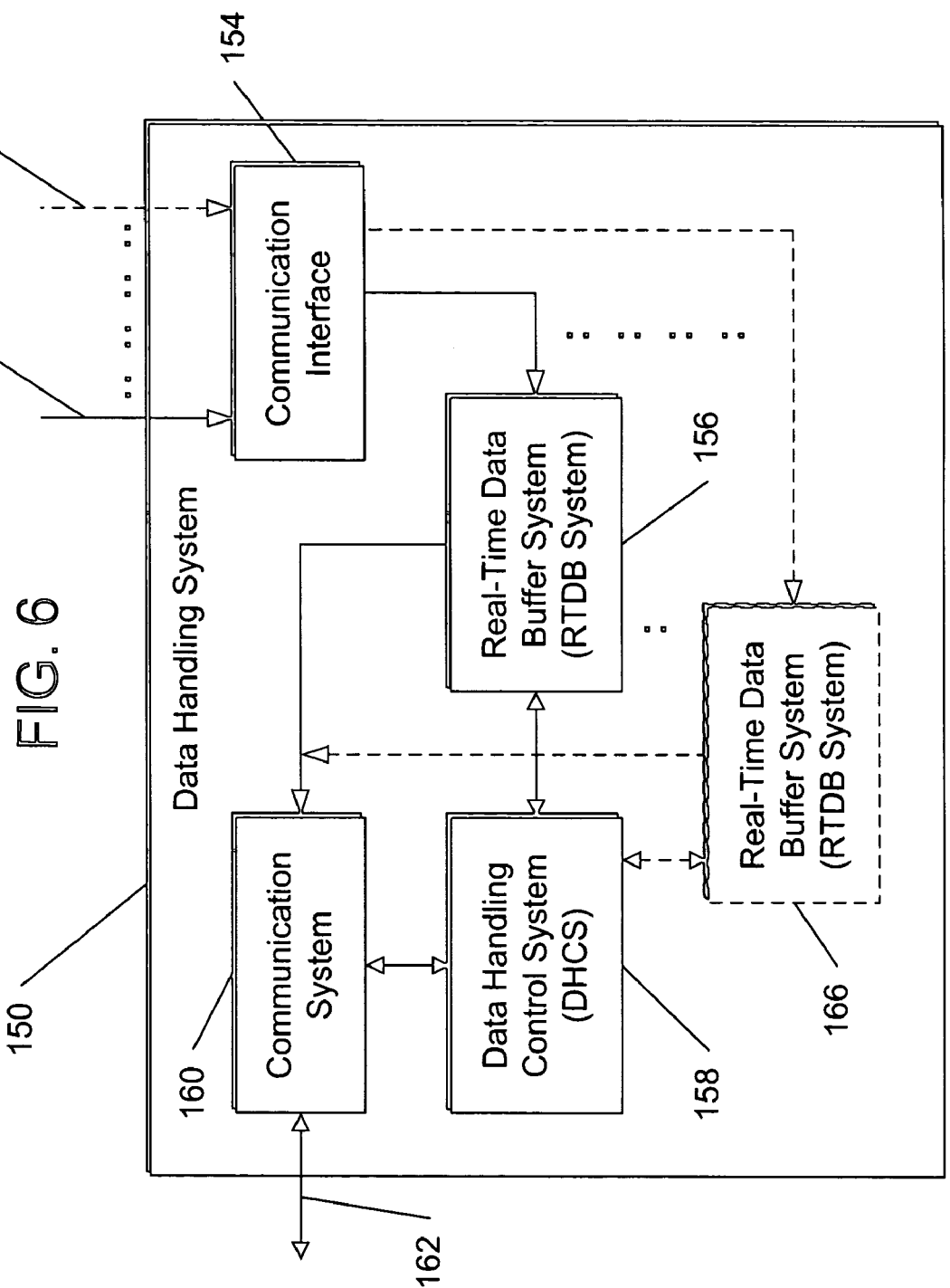
FIG. 6 shows a block diagram of an exemplary embodiment of a data handling system for managing and guaranteeing the flow of real-time data from the target system of FIG. 1.

Referring now to FIG. 6, the data handling system 18 is shown as an exemplary data handling system 150. The data handling system 150 receives data from the target system 14 via a data link 152, which then enters a novel real-time data buffer RTDB system 156 which is connected to a data handling control system (DHCS) 158 for receiving commands therefrom, and for sending alerts and logs thereto, and also to a communication system 160 for forwarding the guaranteed real time data stream to the user device 12 via a data link 162 that communicates with the user device 12 through the communication link 16.

In contrast to previously known systems in which only discrete periodic target system snap-shots were sent to the user, or in which only a single component of a target system could be monitored or managed in real-time, the technique of the present invention enables the target system to continuously generate a real-time data stream limited only by the rated capacity of the RTDB system 156. The RTDB system 156 is the key feature of the data handling system 150, because must be capable of continuously recording real-time data received from the target system 14 without any data loss during data transmission. Therefore, the RTDB system 156 must be capable of simultaneous recording and transmission of large volumes of data, as well as of verification of data integrity. Optionally, if the data handling system 15 is configured for working with multiple target systems, it lay have one or more additional incoming data links 160 and correspondingly one or more additional RTDB systems 164.

Figure 7:
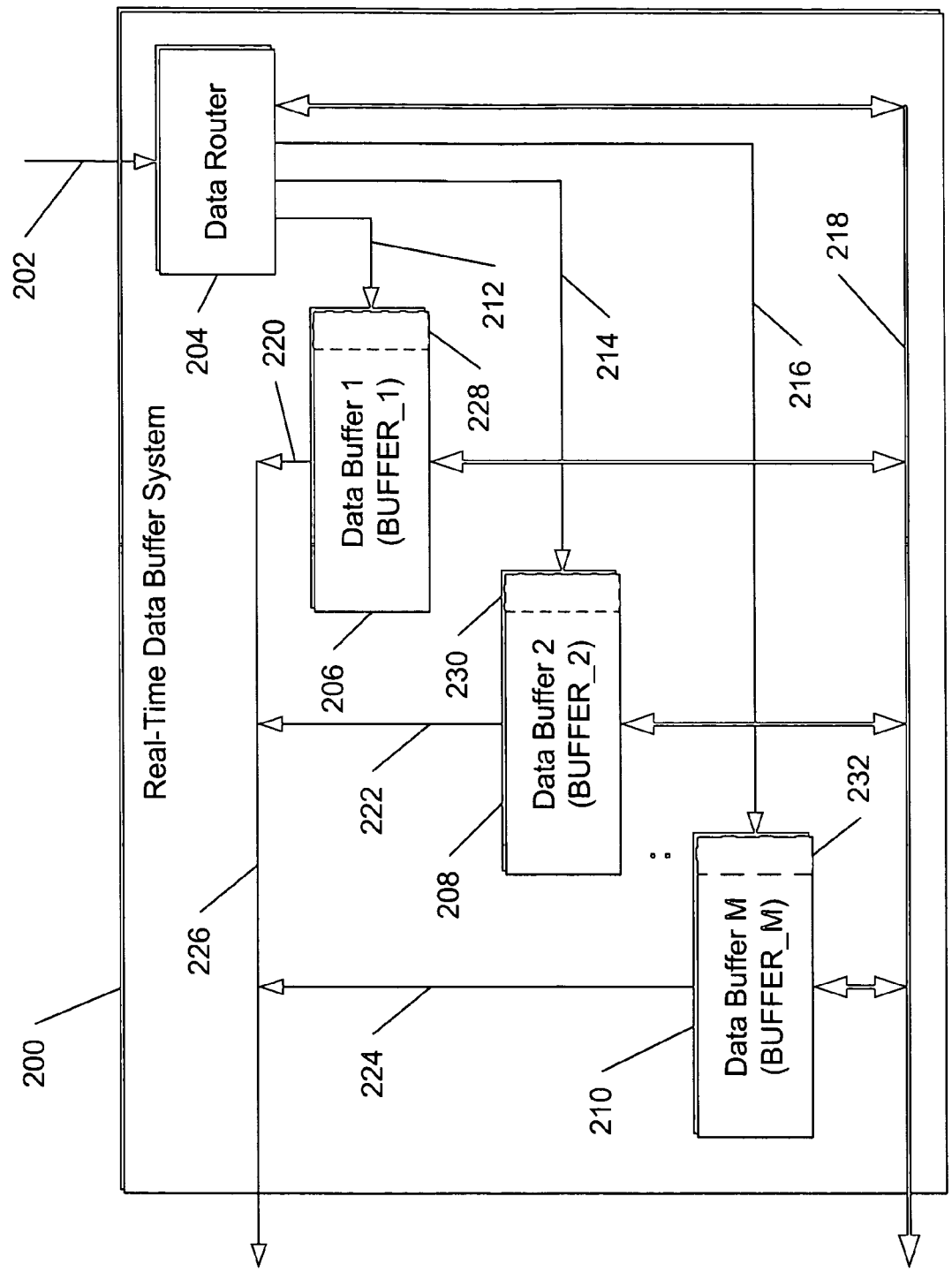
FIG. 7 shows an exemplary embodiment of a real time data buffer system used by the data handling system of FIG. 6, in accordance with the present invention.
Figure 8:
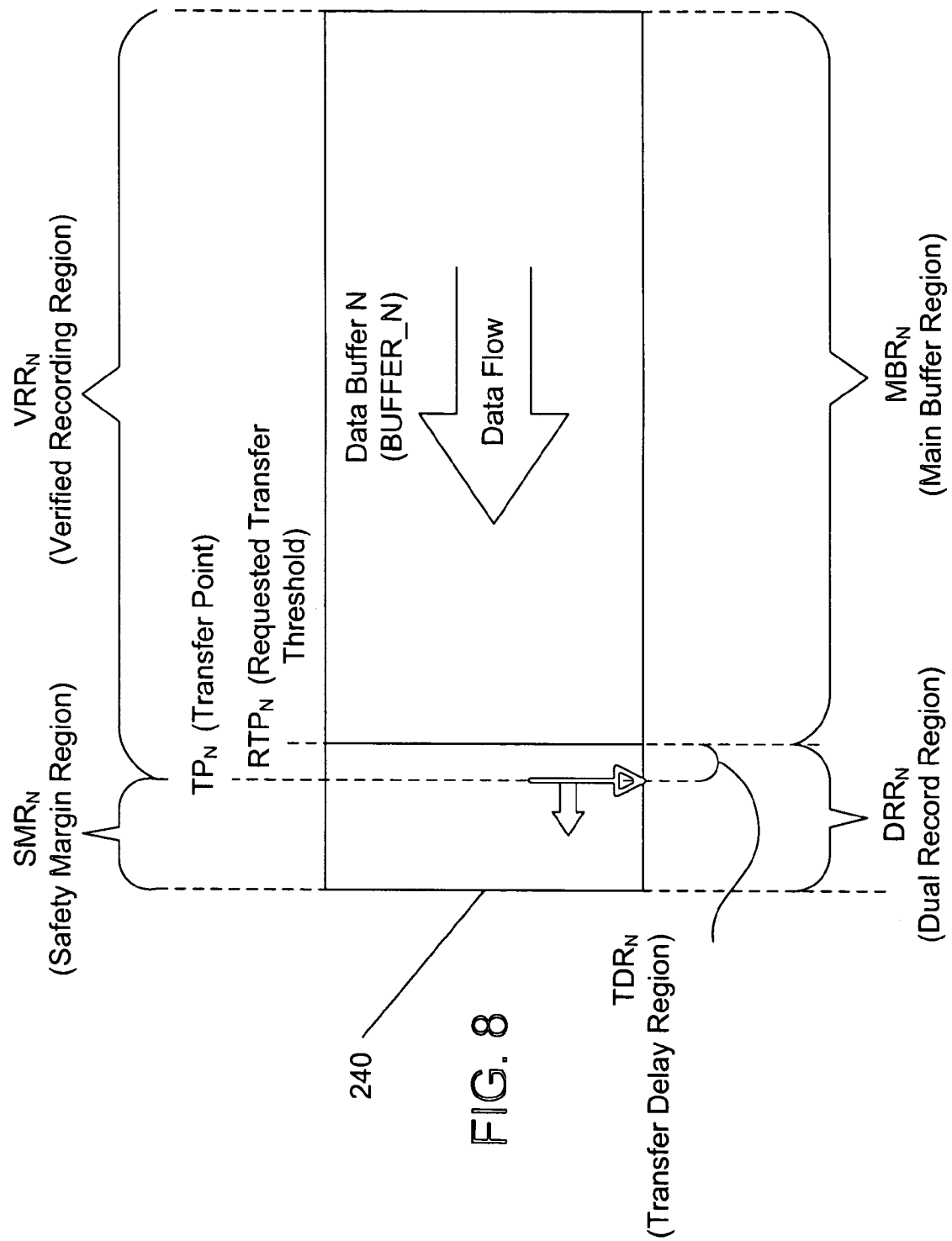
FIG. 8 shows a diagram representative of the operational values and variables of a buffer component of the real time data buffer system of FIG. 7.
Figure 9:
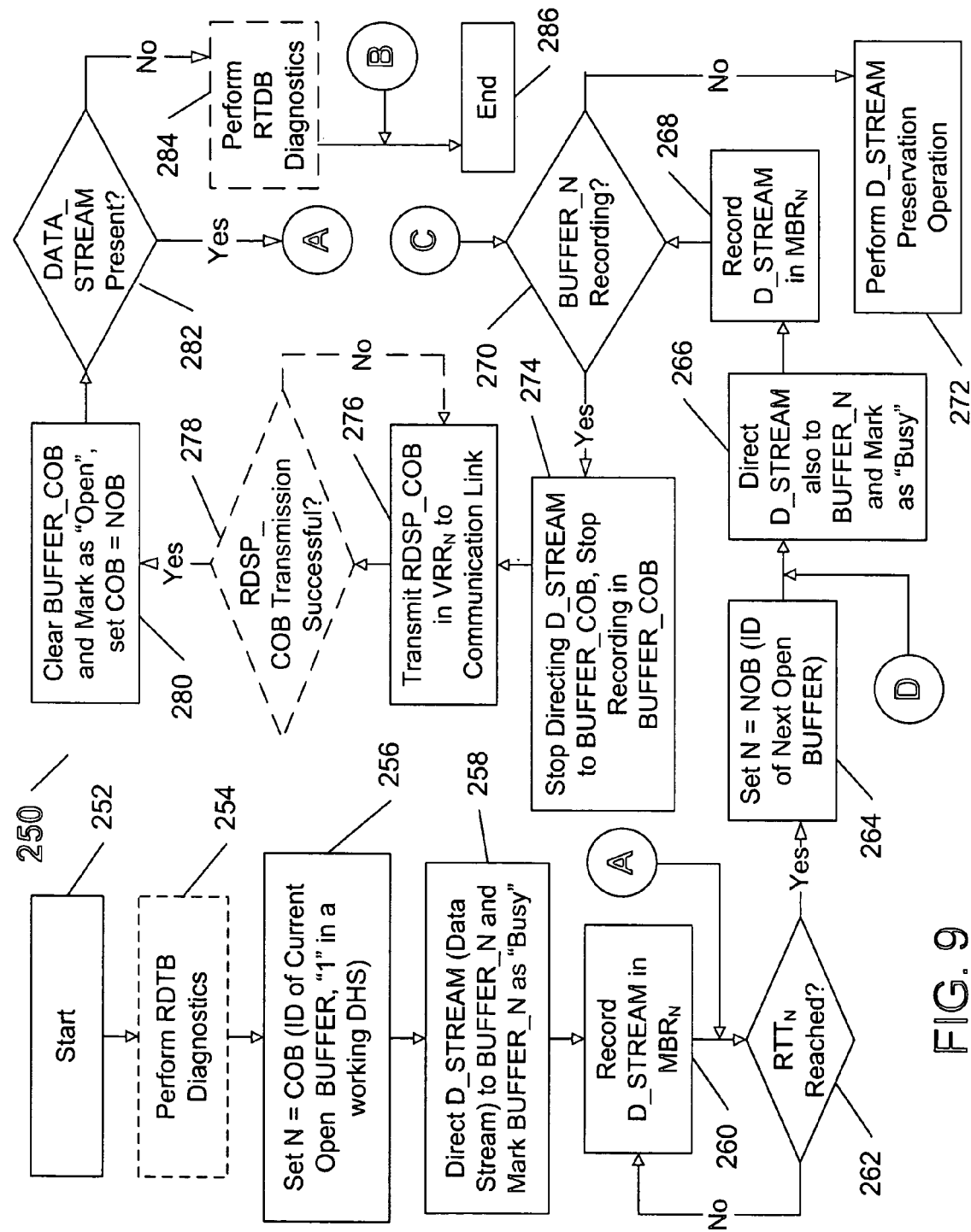
FIGS. 9-11 show process flow diagrams of process steps selectively performed by the real time data buffer system of FIG. 7 during its operation.
Figure 10:
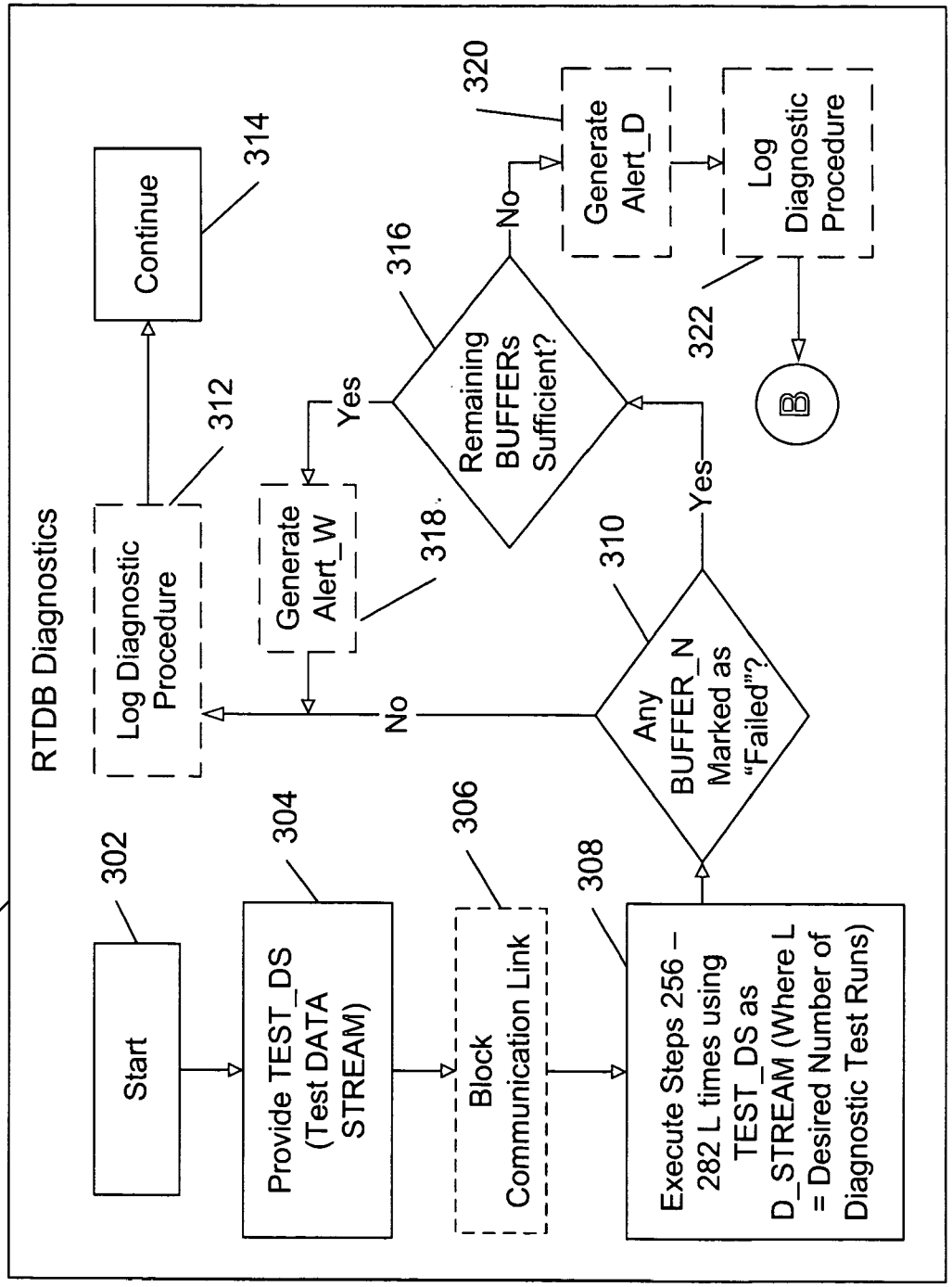
Figure 11:
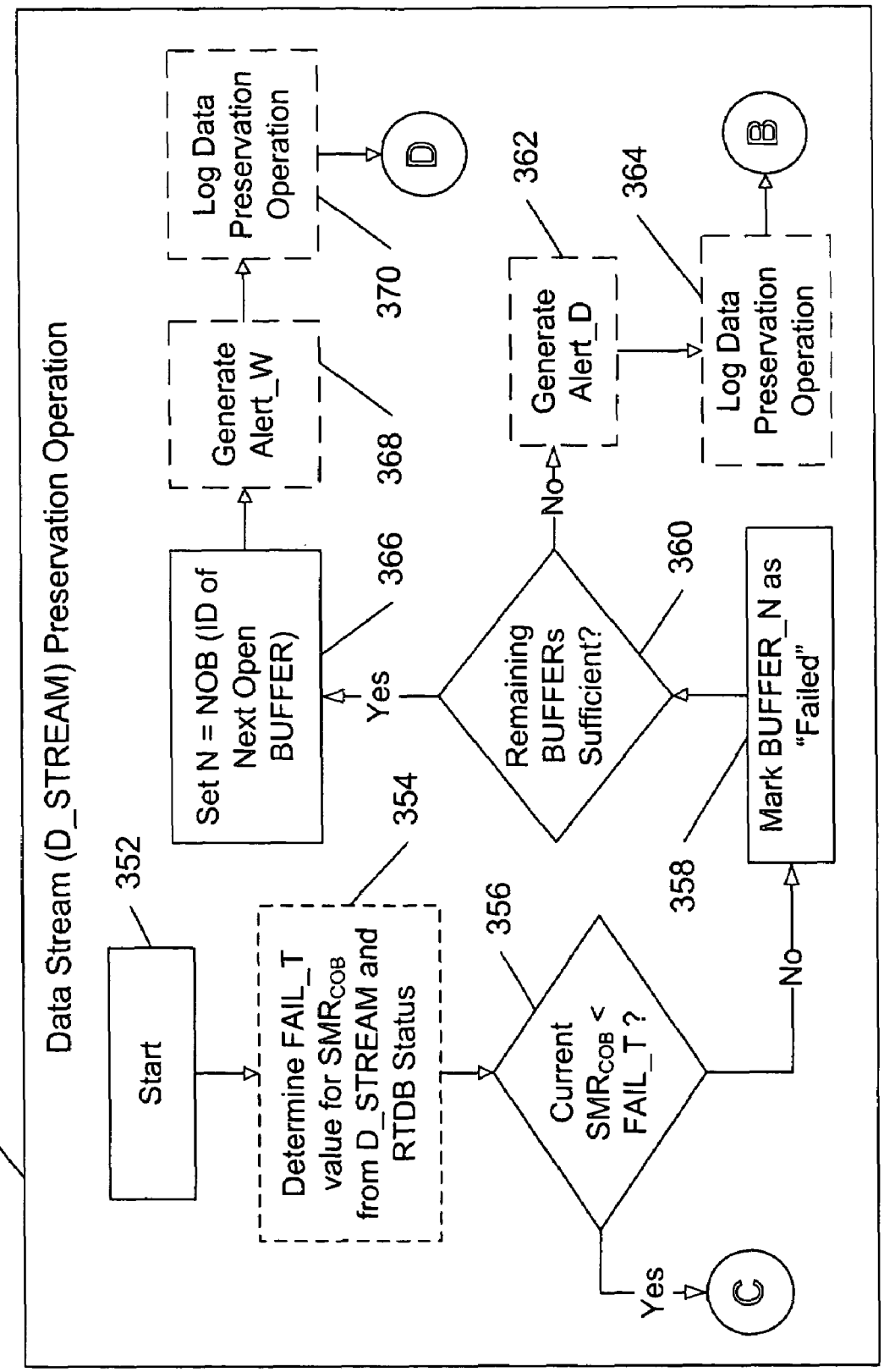

While any RTDB system that meets the above requirements may be readily utilized by the data handling system 150, a preferred embodiment of a novel RTDB system 200 is shown in FIG. 7. Referring now to FIG. 7, in summary, the RTDB system 200 uses a group of two or more physical or logical buffers (BUFFER_1 . . . BUFFER_M) (or a combination thereof) under control of the DHCS 158 (or optionally as directed by a data router 204) to ensure that none of the data arriving from a link 202 is dropped or lost (unless the entire RTDB system 200 completely fails). Each buffer has a predefined dual recording region and a threshold indicating that the data being recorded and filling the buffer has reached that region. Preservation of continuous real-time flow of data is accomplished by recording the data stream in one buffer (206) until a predetermined transfer point corresponding to the dual recording region threshold is reached, in which case the next buffer (208) begins simultaneously recording the data stream. When the fact that the second buffer (208) has started recording is verified, the RTDB system 200 stops recording data in the first buffer (206), and transmits the data recorded in the main portion of the buffer before the transfer point and also any data present in its dual recording region which may have been recoded during the time between the predetermined transfer point and the time the next buffer (208) actually started recording the stream. This ensures that even of there is a delay in switching between buffers, not data is lost. The process is then cascaded through the remaining buffers until BUFFER_M (210) is reached. Data stream routing to the buffers 206-210 may be accomplished through selection of lines 212-216 by the router 204, or by sending data to all lines simultaneously and controlling access to the buffers 206-210 through respective gates 228-232. Referring now to FIG. 8 an exemplary representation of the operation of one of the buffers of FIG. 7, is shown as a buffer 240. In FIG. 9, a process flow 250 is shown that demonstrates operation of an exemplary RTDB system of FIGS. 7 and 8 through performance of steps 252-286, while an optional sub-process 300 of FIG. 10 provides diagnostic procedures in steps 302-322 to test the RTDB system periodically, or immediately preceding or following its use. Another sub-process 350 shown in FIG. 11, enables the DHCS 158 (or equivalent control system) through steps 353-370 to ensure that no data loss occurs if a particular buffer does not being recording immediately after being instructed to do so, and to close buffers that failed recording attempts. Both sub-processes 300 and 350 include alarm and log features.

Returning now to FIG. 1, the user device 12 may also be connected to an optional second communication link 34 (which may be of the same or different type as the communication link 16) for communication with another user device or with another target system (for example if the target system 14 is local and directly connected to the user device 12, through the communication link 16 in form of a cable, a connection to another target system (not shown) in a remote location requires the user device 12 to connect through an alternate communication link 34 (such as a network)).

Optionally, the user device 12 may be connected to one or more additional target systems (shown as an additional target system 36) and receive guaranteed real-time data either through the data handling system 18 or from other data handling system(s) corresponding to the additional target system(s) (shown as data handling system 38).

Referring now to FIG. 2, an alternate embodiment of the IRMM system 10 of FIG is shown as an exemplary IRMM network 40. The user devices, communication links, data handling systems and target systems shown in FIG. 2 are as described above in connection with the systems 12, 14, 18 and link 16 of FIG. 1. The different elements shown in FIG. 2 can be either in the same or in remote geographic locations. For example, user devices 42 and 50 may be in the same building, while user device 56 may be in another country.

The IRMM network 40 illustrates the fact that multiple user devices, (for example user devices 42, 50, 56) may be connected to one another through one or more communication links 44, 52 to either jointly monitor/manage a single target system (e.g. user devices 42, 50 and the target system 46) or enable a single user to monitor multiple target systems (e.g. user device 56 and target systems 46, 60), through multiple data handling systems separate from, or incorporated into a target system (e.g. data handling systems 48, 60). The quantities of the various elements illustrated in FIG. 2 as part of the IRMM network 40 are shown by way of example only and may vary greatly without departing from the spirit of the invention. For example, using the IRMM network 40, hundreds of users in dispersed geographic locations may simultaneously monitor/manage a complex target system with multiple sub-systems, for example a space shuttle during a launch.

Referring now to FIGS. 3 and 4, several exemplary embodiments of the target system 14 of FIG. 1 are shown. Referring first to FIG. 3, an exemplary basic configuration embodiment of a target system 14 is shown as a target system 50. The target system 50 includes two target components, 52 and 54, but may include only a single target component in the simplest configuration, or may include a far greater number of target components as a matter of design choice. The target components can vary from simple, such as temperature sensor, to very complex multi-function embedded systems in their own right, such as a programmable controller, an industrial robot, or an aircraft.

As described above, while an actual real-world target system or device may have many physical components, the IRMM system 10 works with the functional target components (e.g., target components 52, 54) of the target system 50 that are capable of performing one or more actions and/or provide data response to internal instructions or received commands. For example, the target component 52 may be a simple temperature sensor, while the target component 54 may be a programmable controller that performs a number of tasks and issues a number of commands to other target systems in response to a particular temperature reading received from the target component 52.

It should be noted that, because a target component (e.g., target component 52) may in itself be a full multi-component system, a particular complex target system may in fact contain a number of other target systems as its components, and those systems may include target systems acting as target components as well, and so on. In fact, this may be a necessary approach when designing very complex systems.

Under certain circumstances, it may be desirable to work with a test target system that includes one or more emulation target components—devices that are capable of emulating the features, outputs, responses to inputs, and other attributes, of the corresponding production target component. For example, an emulation target system may be entirely comprised of emulation target components to test the instruction modules for a designed target system in the safety of a lab or a workshop and at minimal investment.

Referring now to FIG. 4, an exemplary complex embodiment of a target system 14 is shown as a target system 70, that depicts, by way of example, the various types of target systems discussed above as target components of the system 70 in themselves. Thus, the target system 70 may include one or more of: an emulation target system 72 having only emulation target components; two production target systems 74 and 76, having only production target components in each, and an emulation target system 78, that includes both emulation target components and one or more test target components (i.e. production target component(s) being tested).

As noted above, utilization of the novel IRMM system requires certain information about the target system to enable its management/monitoring. Typically, such information may be represented by the TSI_Model. The complexity of a TSI_Model, or equivalent, depends in part on the complexity of the target system and/or its individual target components. For example, for a particular target component, information can range from very simple list of target capabilities, I/O signals and required protocols to communicate with other target components, to a detailed and comprehensive record that includes additional target information such as rules for using this component with other components, values for physical characteristics, installation requirements, and even the cost or lead time for purchasing the component. The type, quantity, and scope/detail of target component information may be dependent on the complexity and nature of the target system, on whether a particular target component is a production or emulation component, or on other factors, such as the desired precision, the level of control being made available to the user by superiors, or simply on the availability of the information about a particular target component. The TSI_Model also relies on other information such as the connections between specific target components, their relationships and interactions and the flow of signals and other information (this is typically represented by the PS_MODEL).

However, for the purposes of the IRMM system 10 only a very small part of that information is truly necessary. In fact the only information needed from the TSI_Model is the types of actions that the various target components can perform, and what information may be collected from them (i.e., the TSI_Model attributes or TSI_Attributes). The only other information required is instructions on how to contact and connect to the specific target system to be monitored/managed. Thus, preferably, instead of working with a TSI_Model, the IRMM system 10 utilizes a representative data record (RD_Record) that contains the minimum information necessary for its operation. The use of an RD_Record has many advantages—for example it is many orders of magnitude smaller than the TSI_Model, it is easily editable, and because a TSI_Model cannot be recreated from it, it can be used on any user device 12, without need for the user to have expensive system development and/or modeling tools that were used to build the TSI_Model.

Figure 5:
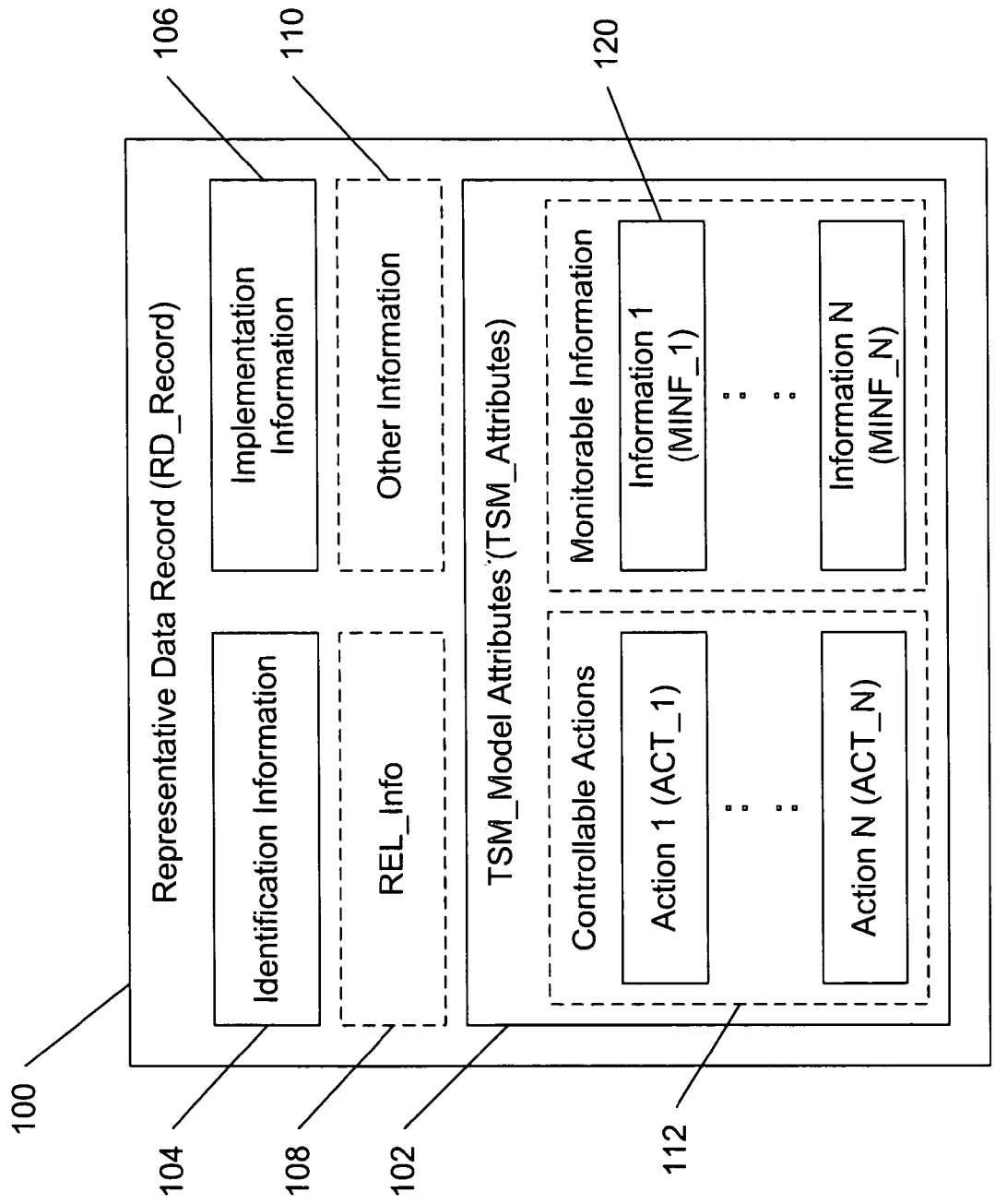
FIG. 5 shows a diagram of an exemplary data record that is representative of one or more previously designed target system implementation model.

Referring now to FIG. 5, a representation of the scope of possible information that may be present in a RD_Record corresponding to the target system 14, is shown as an exemplary target RD_Record 100. The most important part of the RD_Record 100 are the TSI_Attributes 102, that may include one or both controllable actions attributes 112 and monitorable information attributes 118. Controllable actions 112 includes a list of one or more actions (ACT_1 . . . ACT_N) that the target system model 14 is capable of performing (or even the instructions it is capable of receiving and executing, such as commands from the user to change one or more of the system's operational parameters), while monitorable information 118, includes a list of one or more items of information (INF_1 . . . INF_N) that may be received from the target system. The actions and information items in attributes 112, 118 may also include identifying information as to which specific target component they belong.

The RD_Record 100 also includes identification information 104 identifying which target system 14 it represents, and implementation information 106 with instructions on how to connect to the target system 14 through the communication link 16 and conduct the management/control operation. The RD_Record 100 may also optionally include information identifying one or more related RD_Record that correspond to other target systems that relate to the target system 14 or that may be monitored/managed from a single session. This "relationship" information is stored as REL_Info 108. Other optional information may also be included as other information 110. Preferably, the RD_Record 100 is created in a simplified format (for example as a text or initialization file) that may be readily edited by the user if a change is desired or necessary without having to generate a new RD_Record from the TSI_Model. This may be useful in case of a change of target system 14 location that occurred after the RD_Record was generated. Then, the user only needs to edit the implementation information 108 to start using the RD_Record 100. The utilization of the RD_Record 100 by the IRMM system 10 is discussed in greater detail below in connection with FIGS. 12-20.

As noted above, in connection with FIG. 1, the key novel features and operation of the IRMM system 10 are controlled and configured by performance of one or more inventive processes implemented as data processing tasks (such as stand-alone programs, macros, applets, program modules, programs, or any other form of executable task performance instruction sets), that are executed by the user device 12 during utilization by the user thereof.

Nevertheless, for the sake of clarity, and without any limitation from the nomenclature, the core data processing task responsible for enabling the key operations of the inventive IRMM system 10, that is performed by the user device 12, will hereinafter be referred to as a "main program", while additional data processing tasks will hereinafter be referred to as a "program modules".

Figure 12:
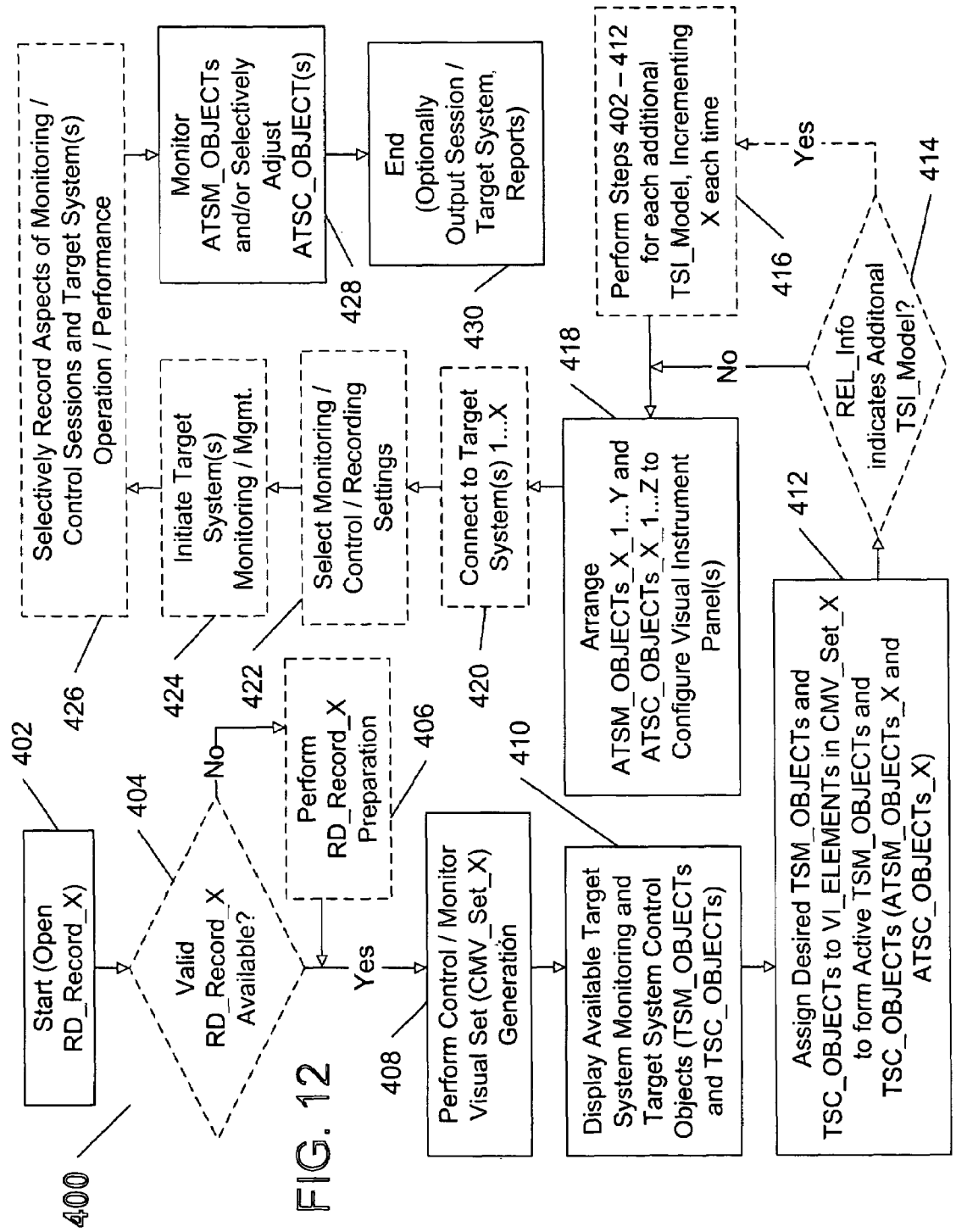
FIGS. 12-14 show process flow diagrams of process steps performed by the IRMM system of FIG. 1 in conjunction with input from a user thereof, in accordance with the present invention to configure and design a visual instrument panel GUI that may be used to manage and/or monitor a target system.
Figure 13:
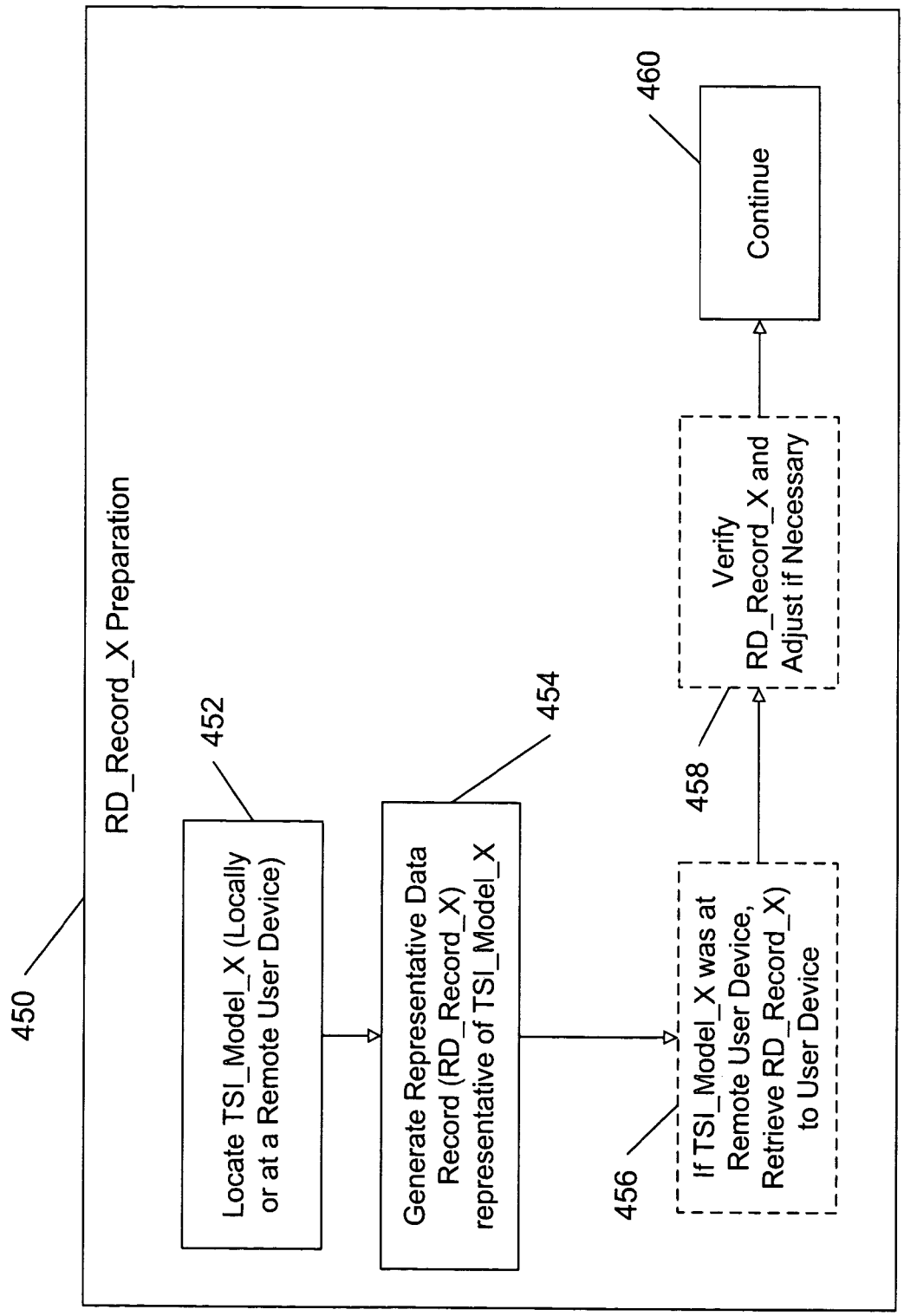
Figure 14:
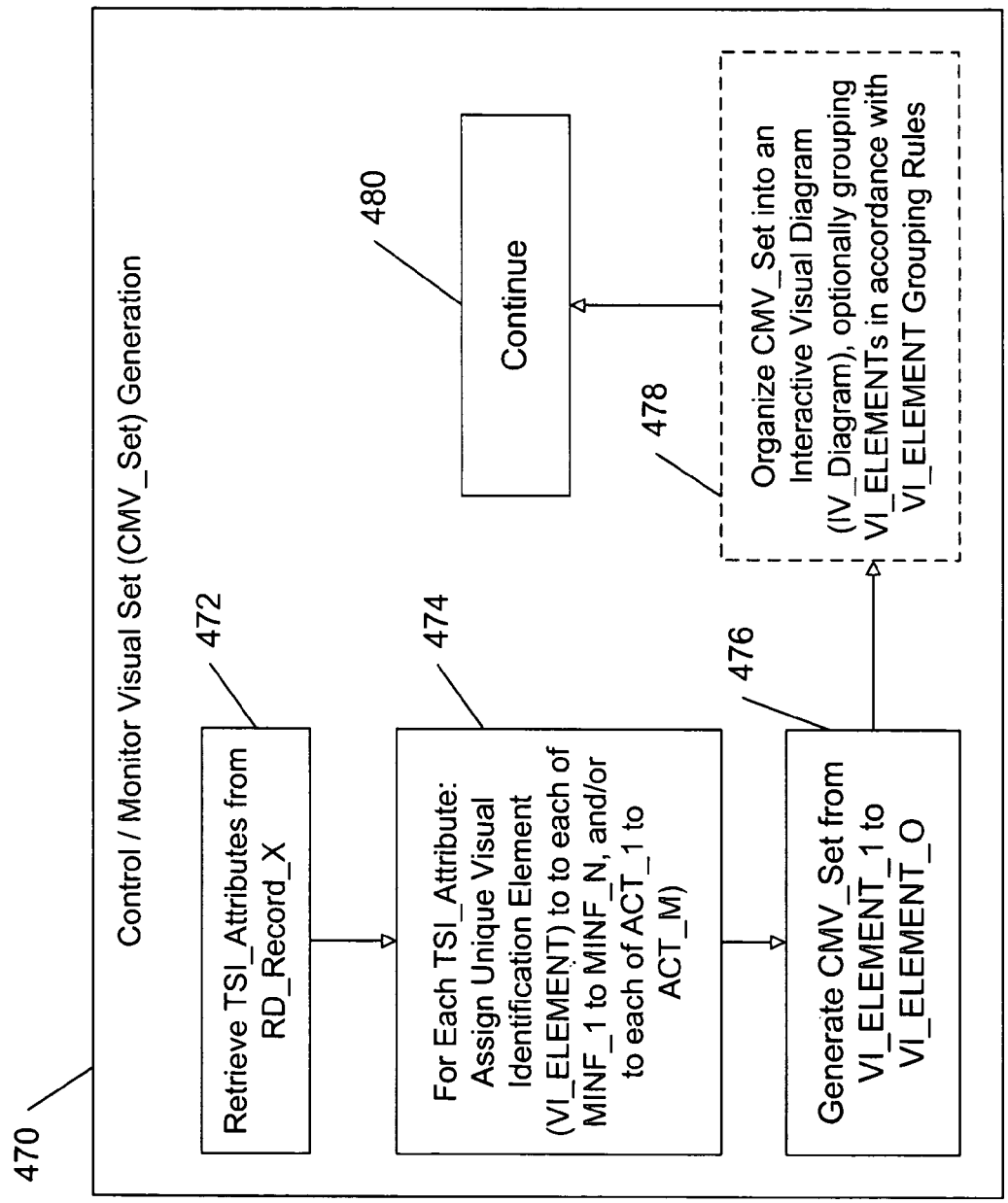

Referring now to FIGS. 12 through 14, a main process diagram 400 and sub-process diagrams 450 and 470, are shown. In accordance with the present invention, the main process diagram 400 and sub-process diagrams 450 and 470 are representative of a combination of user actions, as well as actions performed by a main program and related program modules, that are executed by the user device 12 of FIG. 1 during the utilization of the IRMM system 10. It should be noted, that only those steps necessary or desirable for IRMM system 10 operation are shown. It is contemplated that execution of application programs and program modules as implemented in various types or configurations of user systems 12, may involve numerous conventional processes and steps not shown here because they are not part of the present invention.

The main purpose of the process 400 (and its sub-processes) is to enable the user to generate an interactive visual instrument panel that may be used as a GUI to interact with (i.e. manage and/or monitor) one or more target systems for which RD_Records are available to the user (or which may be generated by the user). In summary this is done by extracting the various action and information attributes from the RD_Record in form of visual interactive elements (VI_ELEMENTs), and then assigning individual graphical control or monitoring objects (TSC_OBJECTs or TSM_OBJECTs) to each VI_ELEMENT corresponding to the attribute that the user wishes to utilize in the panel. When linked to an attribute, the objects are activated and once the user device 12 is connected to the target system 14, they may be used as "virtual" controls and information indicating displays. The user can arrange the objects to customize the instrument panel in any desired fashion using a provided graphical user interface (for example as the GUIs shown and described below in connection with FIGS. 21-23. Other configurations are also possible in different embodiments of the present invention, for example splitting or duplicating instrument panels across multiple proximal or remote displays (as shown in FIG. 24). An exemplary visual instrument panel arrangements is described below in connection with FIG. 25.

Advantageously, the process 400 (and its sub-processes) may be executed in a dedicated software environment (for example as a self-contained application program), or, alternately, may even be implemented as "add-ons" to any conventional visual design and/or modeling system or environment, for example as "plug-ins", "applets" or "toolboxes." This enables the user to utilize a familiar design environment, commands, and user-interface, while at the same time taking full advantage of the novel features and capabilities of the IRMM system 10. This flexibility in working with other available or custom modeling systems and design tools in any environment or operating system with only minor adjustments, makes the novel IRMM system 10 truly platform and vendor-independent.

Because of numerous abbreviations used in FIGS. 12-14, Table 1 below provides a useful definition guide to the terms used in the respective figures.

TABLE 1

(Terms in FIGS. 12 to 14)

| Abbreviation | Definition |
| --- | --- |
| RD_Record | Representative Data Record |
| TSI_MODEL | Target System Implementation Model |
| CMV_Set | Control/Monitor Visual Set |
| TSC_OBJECT | Target System Monitoring Object |
| TSM_OBJECT | Target System Control Object |
| ATSC_OBJECT | Active Target System Monitoring Object |
| ATSM_OBJECT | Active Target System Control Object |
| VI_Element | Visual Information Element |
| MINF | Monitorable information |
| ACT | Controllable Action |
| IV_Diagram | Interactive Visual Diagram |

The process 400 of the present invention begins at a step 402 where the user (or the user device 12) retrieves the RD_Record_X for the target system to be monitored and/or managed. Alternately, an optional test 404 may be performed to determine if an RD_Record_X is available at the user device 12. If it is not, at an optional step 406, RD_Record_X preparation, shown as the process 450 in FIG. 13, is performed. Referring now to FIG. 13, at a step 452, the process 450 attempts to locate a TSI_Model_X at the user device 12 or, optionally at a remote system (for example a remote system modeling or development workstation), and then at a step 452 generates a corresponding RD_Record_X therefrom). If the RD_Record was created at a remote system, at an optional step 452, the RD_Record is retrieved to the user device 12. Optionally, the RD_Record_X may be verified at a step 458 to ensure it has correct implementation information and adjusted if necessary. The process then continues at a step 600 and proceeds to a step 408.

At a step 408, the process 400 generates a control/monitor visual set (CMV_Set_X)—a representation of TSI_Attributes (e.g. TSI_Attributes 102 of FIG. 4) that the user will later utilize to build the desired visual instrument panel. The CMV_Set_X is generated by the process 470, as shown in FIG. 14. Referring now to FIG. 14, the process 470 begins at a step 472 where the TSI_Attributes are retrieved from the RD_Record_X. At a step 474, the process 470 assigns a unique visual identification element (VI_ELEMENT) to each TSI_Attribute retrieved at the previous step (i.e. to ACT and/or MINF attributes). The variables in the ACT and MINF attributes are noted as N and M because different numbers of each type of attributes may be present.

Each VI_ELEMENT includes a visual portion that identifies, to the user, the specific attribute to which they belong. In addition, the VI_ELEMENT is linked to the assigned attribute such that it can provide all necessary information about the target component to which the ACT or MINF attribute belongs. For example, a VI_ELEMNT may be a word or a line of text (e.g. a file name), or an icon, or other image, but may also contain a location of the appropriate attribute information which may not be visible to the user. The VI_ELEMENTS can also include visual marks, such as images, characters or color that identify them as corresponding to an ACT or a MINF attribute. Optionally, interaction with VI_ELEMENT can enable the user to access as much information about the attribute and/or its parent target component as desired or available.

At a step 476, the process 470 generates the CMV_Set from the VI_ELEMENTs assigned at the previous step by organizing them in a predefined fashion to be displayed to the user. For example, they may be arranged as a list, as icons in a window, or in any other convenient fashion. Optionally, at an optional step 478, the process 470 organizes the CMV_Set into a interactive visual diagram (IV_Diagram), for example in a collapsible directory tree structure, and if desired, can group the various VI_ELEMENTs in accordance with predefined grouping rules (e.g. to group all VI_ELEMENTs by target component or by type (ACT or MINF), or otherwise).

Figure 15:
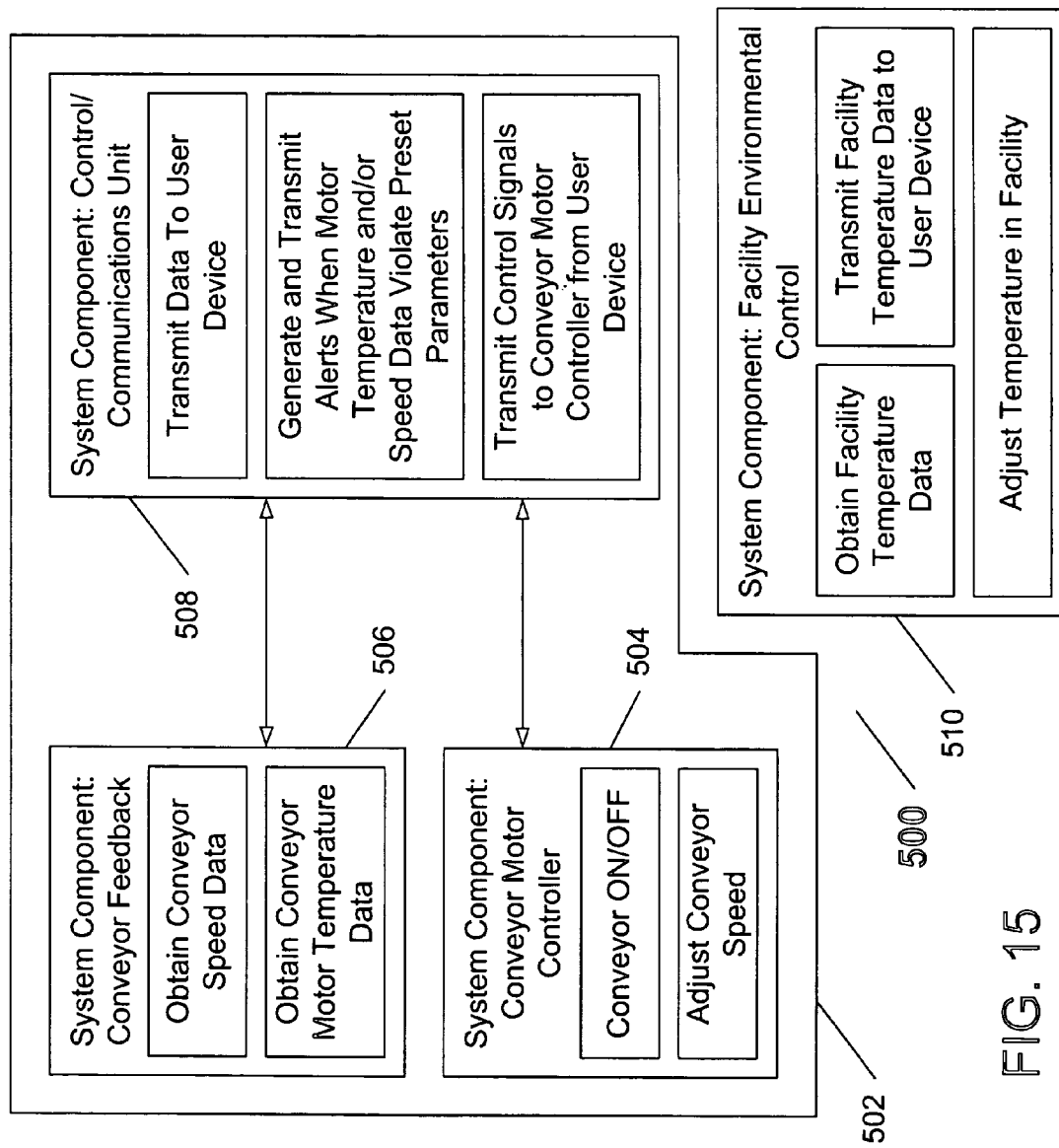
FIG. 15 shows a diagram representative of an exemplary previously designed target system implementation model.

Several exemplary CMV_Set arrangements and IV_Diagrams for a sample TSI_Model (TSI_Model 500 shown in FIG. 15) are demonstrated in FIGS. 16 through 19. Referring now to FIG. 15 an exemplary sample TSI_Model 500 is shown for a target system representing a conveyor installed in a particular facility. The TSI_Model includes two target components—a conveyor component 502 and a facility automation controller 510. The conveyor component 502 is actually a target system in itself with several target components 504-508.

Figure 16:
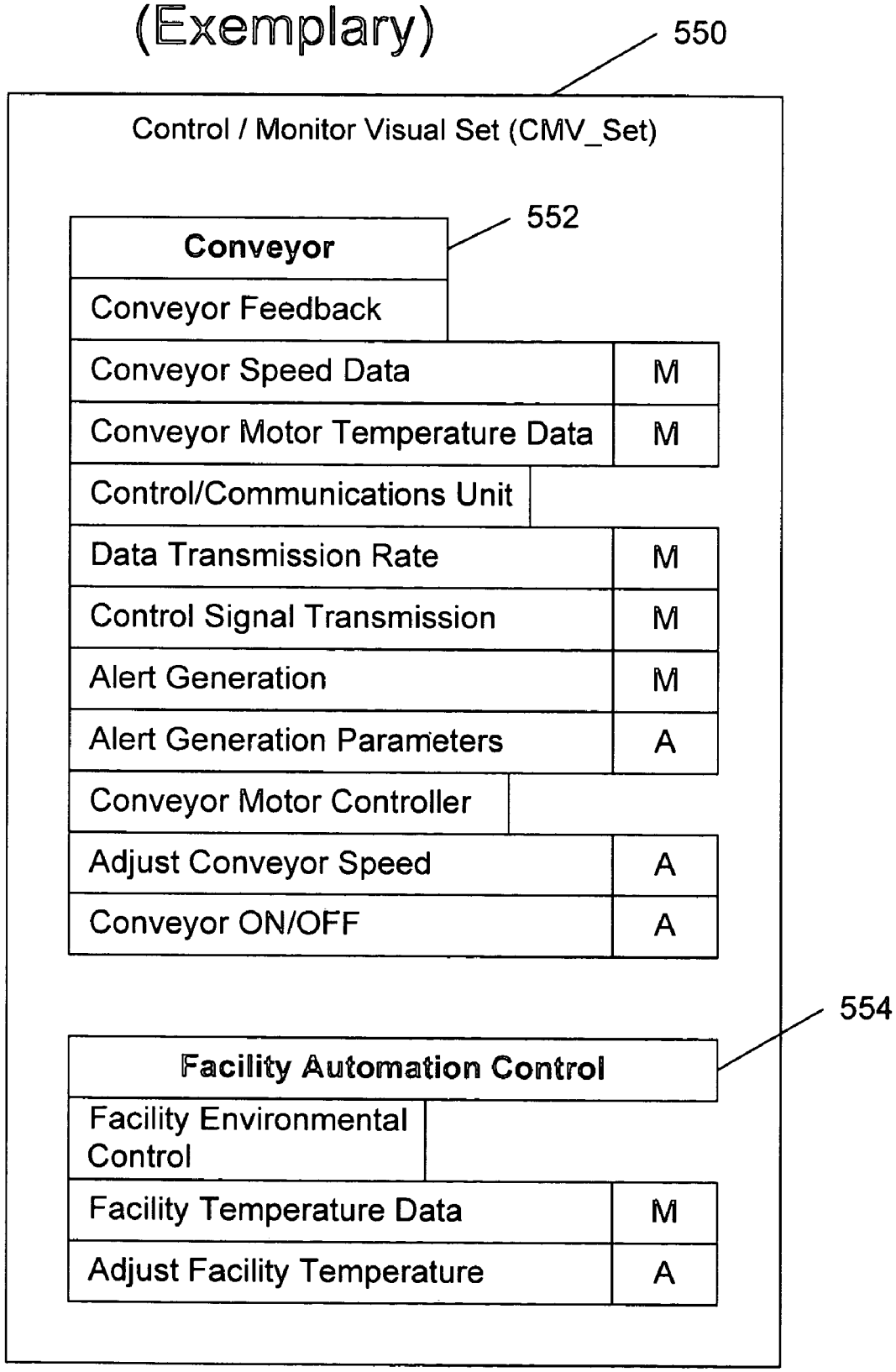
FIGS. 16-19 shows examples of various elements and their configurations that have been generated using the process of FIGS. 9-11 from the target system implementation model of FIG. 15.

The TSI_Model 500 has a variety of attributes representative of actions (e.g., "Conveyor ON/OFF") and monitorable information (e.g., "Obtain Facility Temperature Data") information model elements that represent particular actions and data collection tasks, such as obtaining the speed of a conveyor or controlling temperature in the facility that may be performed or indicated by the various target components 504-510. Referring now to FIG. 16, an exemplary CMV_Set 550 that may have been generated by the process 470 of FIG. 14 from the TSI_Model 500 of FIG. 15. The CMV_Set 550, is shown with a list of all VI_ELEMENTs sorted into two regions: region 552 for VI_ELEMENTs relating to the conveyor, and region 554 for VI_ELEMENTs relating to the facility control system. In addition, VI_ELEMENTS relating to MINF attributes are also marked with "M", while those relating to ACT attributes are marked with an "A".

Figure 17:
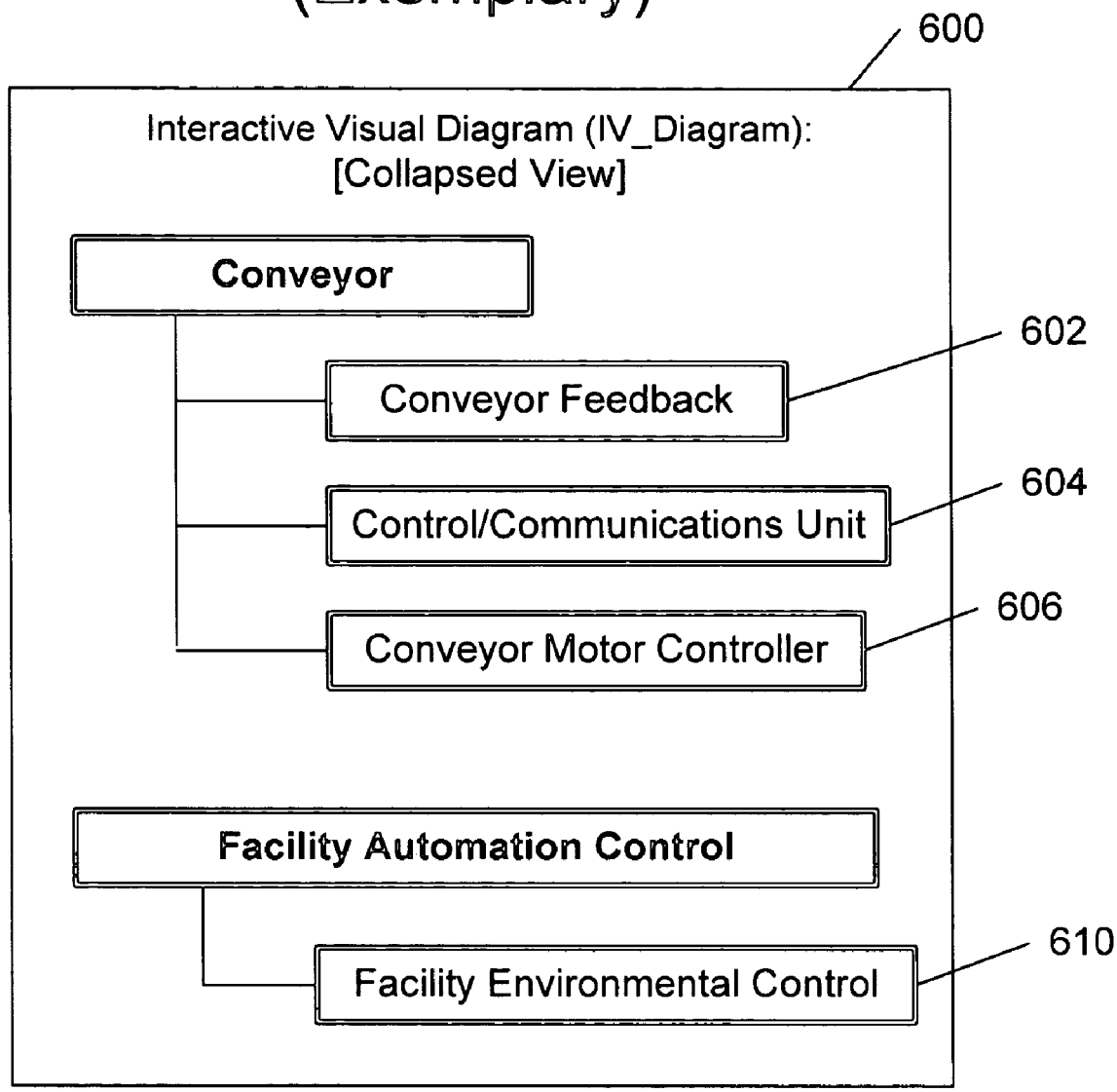
Figure 18:
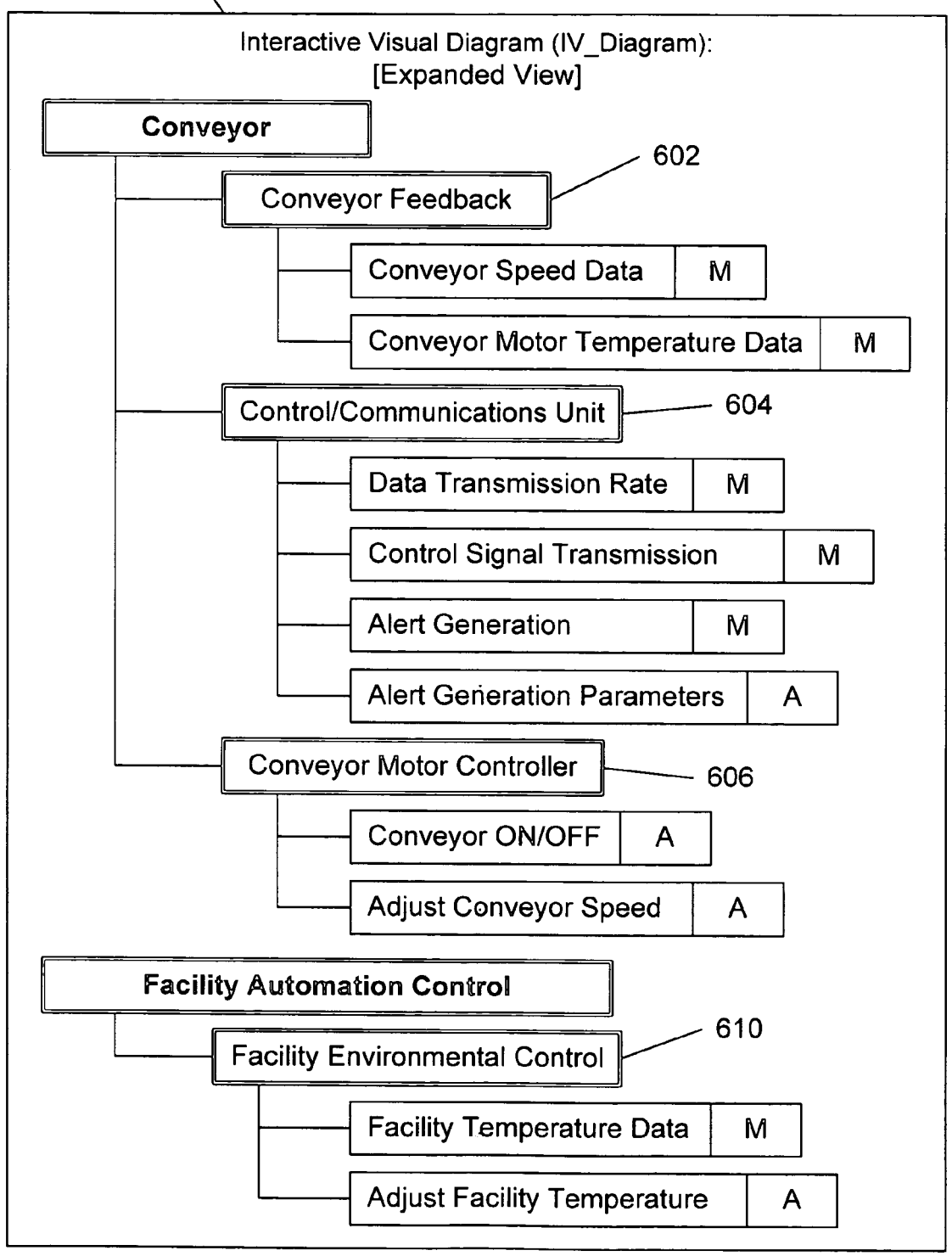
Figure 19:
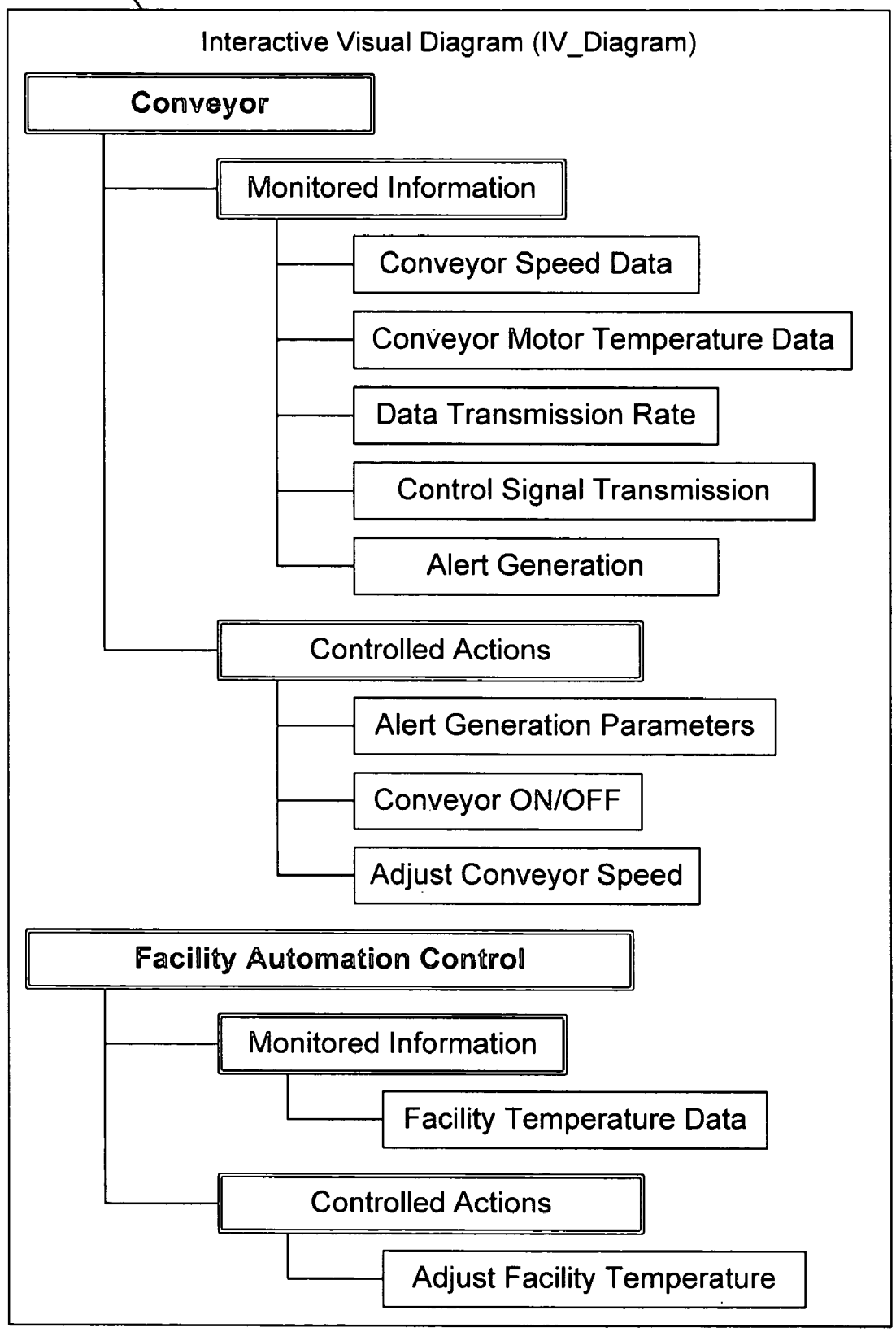

Referring now to FIGS. 17-19, an example of the CMV_Set configured as a IV_Diagram 600, if the optional step 478 of FIG. 14 was performed. In FIG. 17, the IV_diagram 600 is shown in a collapsed tree-diagram view where the target components of the TSI_Model 500 are identified and shown as VI_ELEMENT groups 602 to 608. In FIG. 18 the groups 602-608 are shown in expanded view displaying their VI_ELEMENTs. The IV_Diagram 600 is advantageous because when dealing with a complex target system 14, the user can expand only the VI_ELEMENT groups that are relevant to the task at hand rather than sorting through hundreds that are not needed. It is contemplated that other forms of IV_Diagrams may be readily utilized to accomplish this purpose. In FIG. 19, the IV_Diagram 600 of FIG. 17 is shown as an alternately sorted IV_Diagram 620, in which the various VI_ELEMENTS are sorted by their attribute type.

Figure 20:
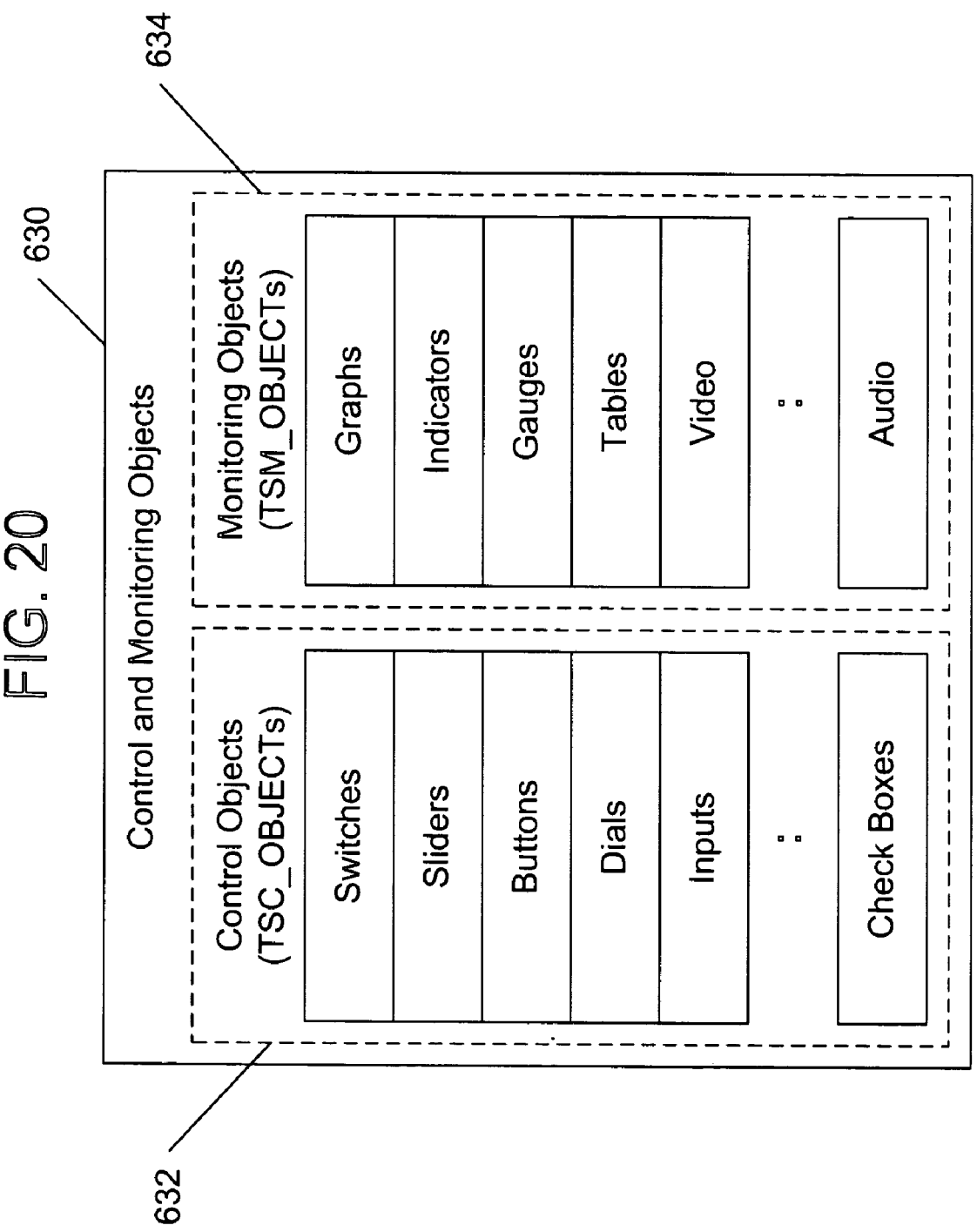
FIG. 20 shows a diagram representative of exemplary objects that may be combined with elements derived from a previously designed target system implementation model (such as exemplary elements of FIGS. 16-19) during performance of the process of FIGS. 9-11 to design a desired visual instrument panel GUI.

Returning now to FIG. 12, at a step 410, the process 400 displays the available target system monitoring and target system control objects (TSM_OBJECTs and TSC_OB-JECTs). As noted above, each type of TSM and TSC object is a graphical representation of linked programs or other forms of executable code necessary to perform the function(s) the objects are designed for. These may be to issue commands to the target system, in case of TSC_OB-JECTs (such a button), or to display specific information received from the target system in a specified format (graph, gauge, etc.), in case of TSM_OBJECTs (such as a speed gauge). Thus the objects may take any form appropriate to their function. And of course user's may freely design any object TSC_OBJECT or TSM_OBJECT for custom or specialized applications. Examples of possible TSC_OBJECTs include but are not limited to: switches, sliders, buttons, dials, inputs, down-down lists, and check boxes. Examples of possible TSM_OBJECTs include but are not limited to: linear, two- and three-dimensional graphs (pie, bar, mathematical function, 2-D, and 3-D, plots, etc.), indicators, gauges, tables, as well as audio and video displays. Referring now to FIG. 20, an exemplary list of control and monitoring objects 630 is shown, that contains TSC_OB-JECT list 632 and TSM_OBJECTSs list 634.

However, the TSM_OBJECTs and TSC_OBJECTs, in their normal state are linked to executable programs without specific operating parameters or values and are thus inactive. In order for the objects to be utilized in an instrument panel for a specific target system, they must be linked to specific VI_ELEMENTs from which they receive all information, values and configuration settings (drawn from the ACT or MINF attributes assigned thereto) to become "active" control or monitoring objects and thus be usable to manage and/or monitor a target system. Thus, at a step 412, the process 400 enables the user to assign desired TSM_OB-JECTs and TSC_OBJECTs to appropriate VI_ELEMENTs in CMV_Set_X to form Active TSM_OBJECTs and TSC_OBJECTs (ATSM_OBJECTs_X and ATSC_OB-JECTs_X). The act of assignment can take many forms, such as "drag-and-drop" operations, drawing links between elements and objects, using a "lasso" tool, by entering commands via a key board or by voice), or in any other fashion convenient to the user and made possible by the GUI being used to interact with the process 400.

Optionally, the process 400 can perform this step automatically in accordance with user-defined rules to select optimal OBJECT—VI_ELEMENT combinations, and present the proposed ATSM_OBJECTs_X and ATSC_OB-JECTs_X to the user for approval or modification. At an optional test 414, if the RD_Record_X includes REL_Info information, the process 400 determines if REL_Info indicates that additional TSI_Models related to the one the user is working on exist. If one or more related TSI_Models exist, at an optional step 416, the process 400 repeats steps 402 to 412 for each TSI_Model and provides it with a unique identifier. Otherwise, at a step 418, the user arranges the ATSM_OBJECTs_X and ATSC_OBJECTs_X in a desired visual instrument panel configuration. As noted above, this may be done in any manner made possible by the GUI being used. For example, the active objects may be selected and dragged-and-dropped into desired positions on the panel. Optionally, the process 400 can perform this step automatically in accordance with user-defined rules to build an optimal visual instrument panel and present it to the user for approval or modification or to assist the user by intelligently grouping various objects together in accordance with certain characteristics (i.e. grouping the objects by target component, or grouping related ATSM_OBJECTs and ATSC_OB-JECTs—e.g. a temperature gauge ATSM_OBJECT positioned next to a temperature control dial ATSC_OBJECT.

Any interactive GUI may be used for performance of steps 410, 412, and 418, that is capable of providing the necessary feature described above in connection with those steps. Several inventive embodiments of exemplary GUIs that would be advantageous for performance of the steps 410, 412 and 418 are described below in connection with FIGS. 21-23.

Figure 21:
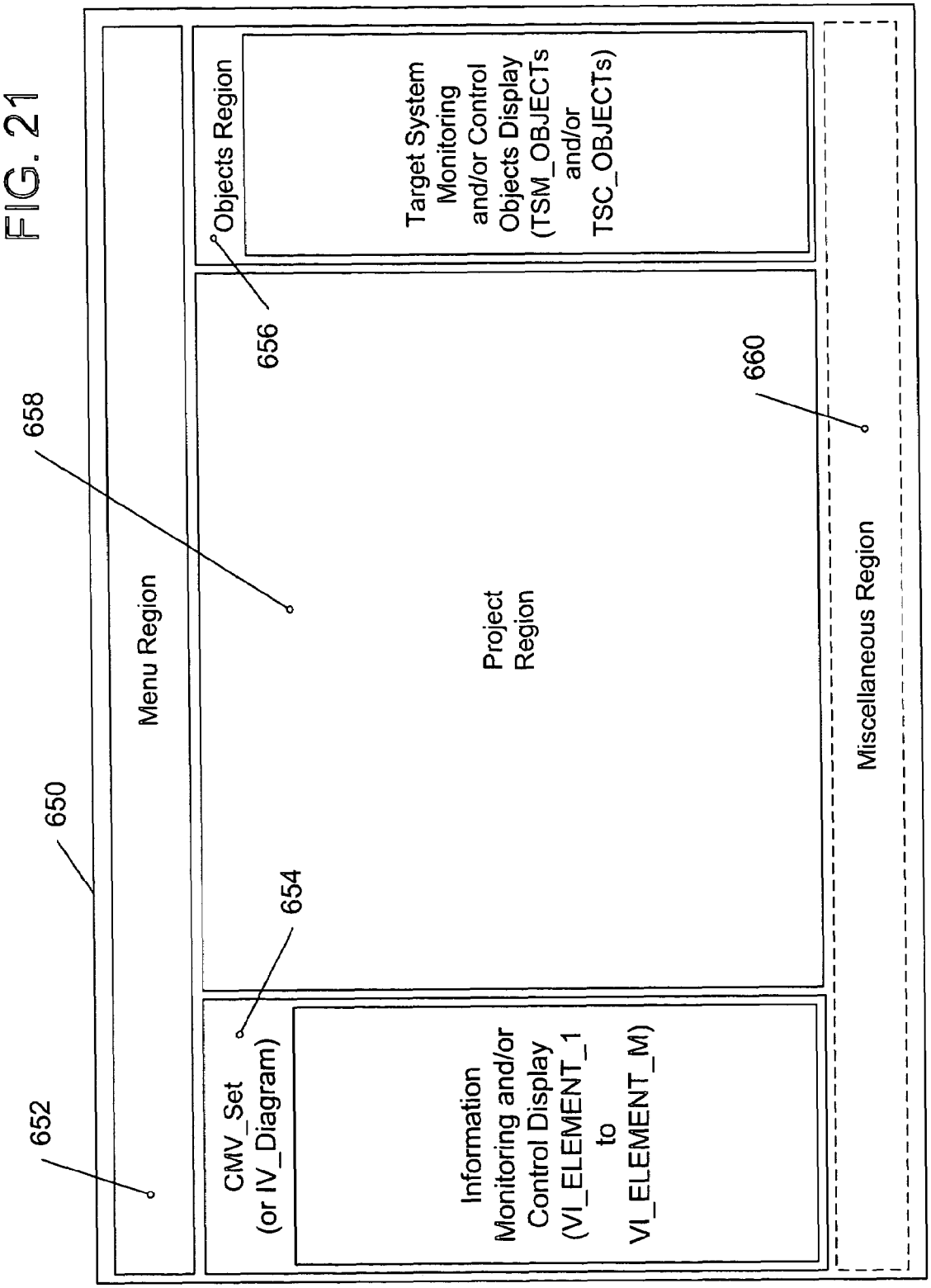

Referring now to FIG. 21, a graphical representation of a first embodiment of an exemplary GUI that may be displayed to the user by the user device 12 via the output system 24 (such as a video monitor), and utilized by the user via the input system 22 to interact with the process 400 (and its sub-processes), is shown as an interface 650. It should be noted that the interface 650 only shows the specific front-end elements relevant to the process 400. Furthermore, the exact sizes and positioning of the various interface 650 regions is shown by way of example only—the regions may be readily re-seized and re-positioned as a matter of design choice without departing from the spirit of the invention.

The interface 650 includes a menu region 652 which may contain selectable menu items to interact with or otherwise control operations of the process 400 and other processes that may be performed by the user device 12, a CMV_set (or IV_Diagram) region 654 that contains displays the VI_ELE-MENTS in the CMV_Set, an objects region 656 that contains the TSM_OBJECTs and TSC_OBJECTs, and a project region 658 where the visual instrument panel is designed and configured by the user. The interface 650 may also contain an optional miscellaneous region 660 where other useful controls and/or displays may be provided for the user. In performance of the steps 410, 412 and 418 of the process 400 of FIG. 12, the user may select a particular VI_ELE-MENT from the CMV_set region 654 to highlight it and then click on a corresponding desired TSC_or TSM_OB-JECT to activate it (or optionally drag the VI_ELEMENT and drop in onto the desired object. The active object may then be positioned in the project region 658 and the process repeated until all the desired active objects have been generated. The user may then arrange the active objects in any desired visual instrument panel configuration.

Figure 22:
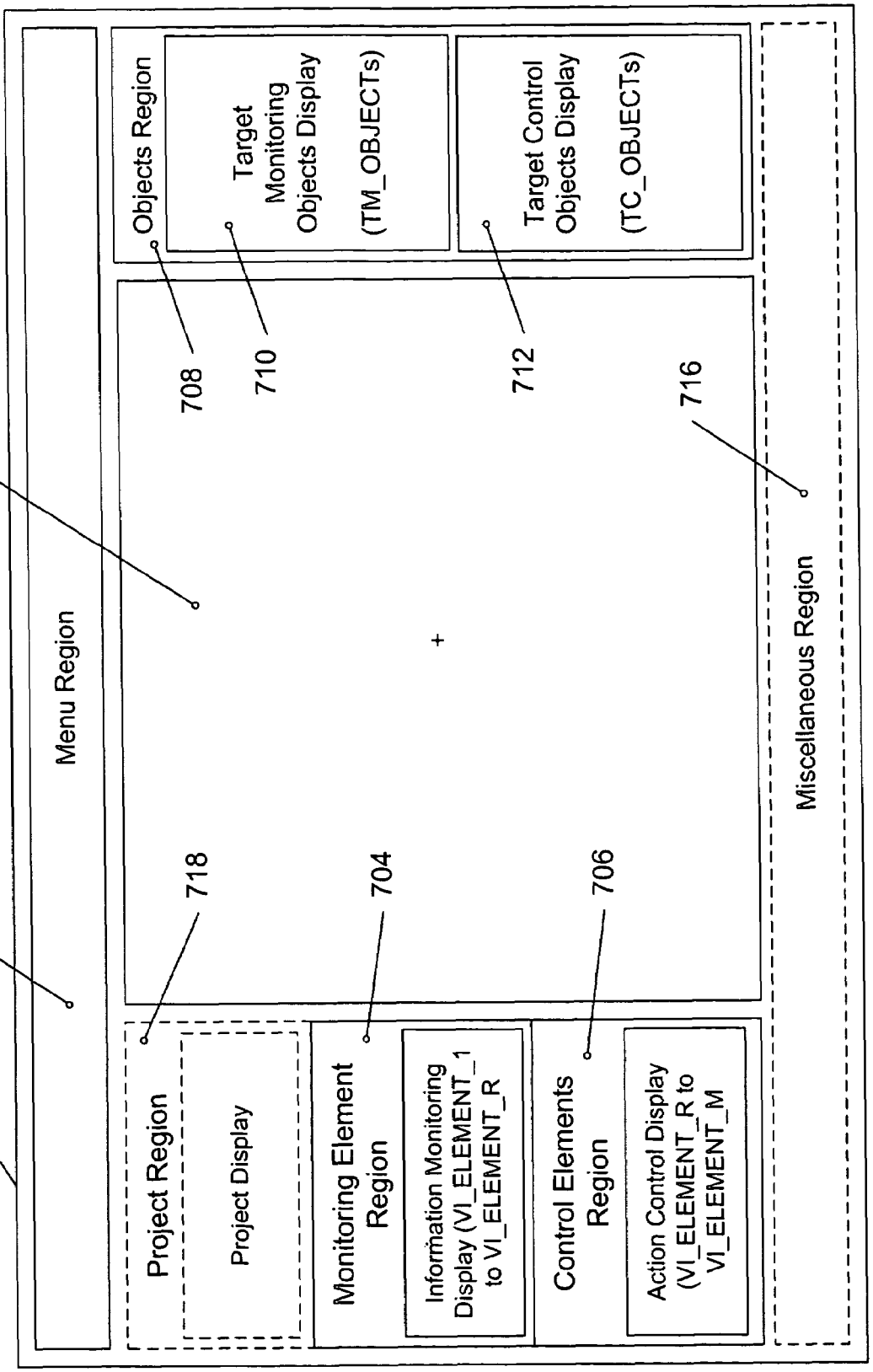

Referring now to FIG. 22, a graphical representation of a second embodiment of an exemplary GUI that may be displayed to the user by the user device 12 via the output system 24 (such as a video monitor), and utilized by the user via the input system 22 to interact with the process 400 (and its sub-processes), is shown as an interface 700. It should be noted that the interface 700 only shows the specific front-end elements relevant to the process 400. Furthermore, the exact sizes and positioning of the various interface 700 regions is shown by way of example only—the regions may be readily re-seized and re-positioned as a matter of design choice without departing from the spirit of the invention.

The interface 700 includes a menu region 702 which may contain selectable menu items to interact with or otherwise control operations of the process 400 and other processes that may be performed by the user device 12, a monitoring element region 704 that displays all VI_ELEMENTs related to MINF attributes, a control element region 706 that displays all VI_ELEMENTs related to ACT attributes, an objects region 712 that contains the TSM_OBJECTs and TSC_OBJECTs, grouped into individual display areas 710 and 712, and a project region 714 where the visual instrument panel is designed and configured by the user. The interface 700 may also contain an optional miscellaneous region 716 where other useful controls and/or displays may be provided for the user. Optionally a project region 718 may also be provided for enabling the user to easily switch between and select various TSM_Models, if more than one are being used to build the instrument panel. Of course, the interface 700 may be readily altered to eliminate any unnecessary regions to increase available display space (e.g. if there are no control VI_ELEMENTs, the TSM_OBJECTs need not be displayed).

As described above, in connection with FIG. 21, In performance of the steps 410, 412 and 418 of the process 400 of FIG. 12, the user may link a particular VI_ELEMENT from the monitoring element region 704 or from the control element region 706, to an appropriate corresponding TSM_or TSC_OBJECT to activate it and then position it the project region 714, and repeat the process until all the desired active objects have been generated. The user may then arrange the active objects in any desired visual instrument panel configuration.

The interfaces 650 and 700 are preferably readily scalable and completely customizable so that they may be easily configured by the user if the output system 24 includes two or more display screens. For example, an interface 750 shown in FIG. 23, may be created from the interface 700 to enable the user to take full advantage of two separate displays, by arranging certain regions of the interface 700 in a first interface portion 752, placing appropriate regions proximal to one another, and positioning the project region and its visual instrument panel display in another interface portion 754. The interface 750 is particularly advantageous because the VI_ELEMENTSs and objects are positioned next to one another next to one another and at the same time the size of the project area is increased.

Referring now to FIG. 24, an alternate embodiment of the interface 750 is shown as a distributed scalable interface 800. As discussed above, in connection with the initial description of the IRMM system 10 of FIG. 1, certain applications may require multiple users to collaborate in monitoring/management of a complex target system or group of systems. In such as case the distributed interface 800 is particularly advantageous as it allows to use a configuration/management in an interface 802 to configure and design one or more visual instrument panels (VI_Panel_1 . . . VI_Panel_P) and then display them in the project regions of interfaces 804 through 806 (while only two additional interfaces are shown, any number may be used as may be desirable or practical, without departing from the spirit of the invention. The interfaces 804, 804 may be connected locally to the user device at which the interface 802 is displayed (for example at a proximal user device or a component thereof in the same area, or they may be located at remote locations in which case the various user systems at which interfaces 802-806 are displayed, interact with one another through an optional communication link 808 (equivalent to the communication link 16 of FIG. 1). Thus, the distributed scalable interface 800 enables multiple users in various locations to collaborate both in target system development, as well as in target system utilization and support.

Figure 23:
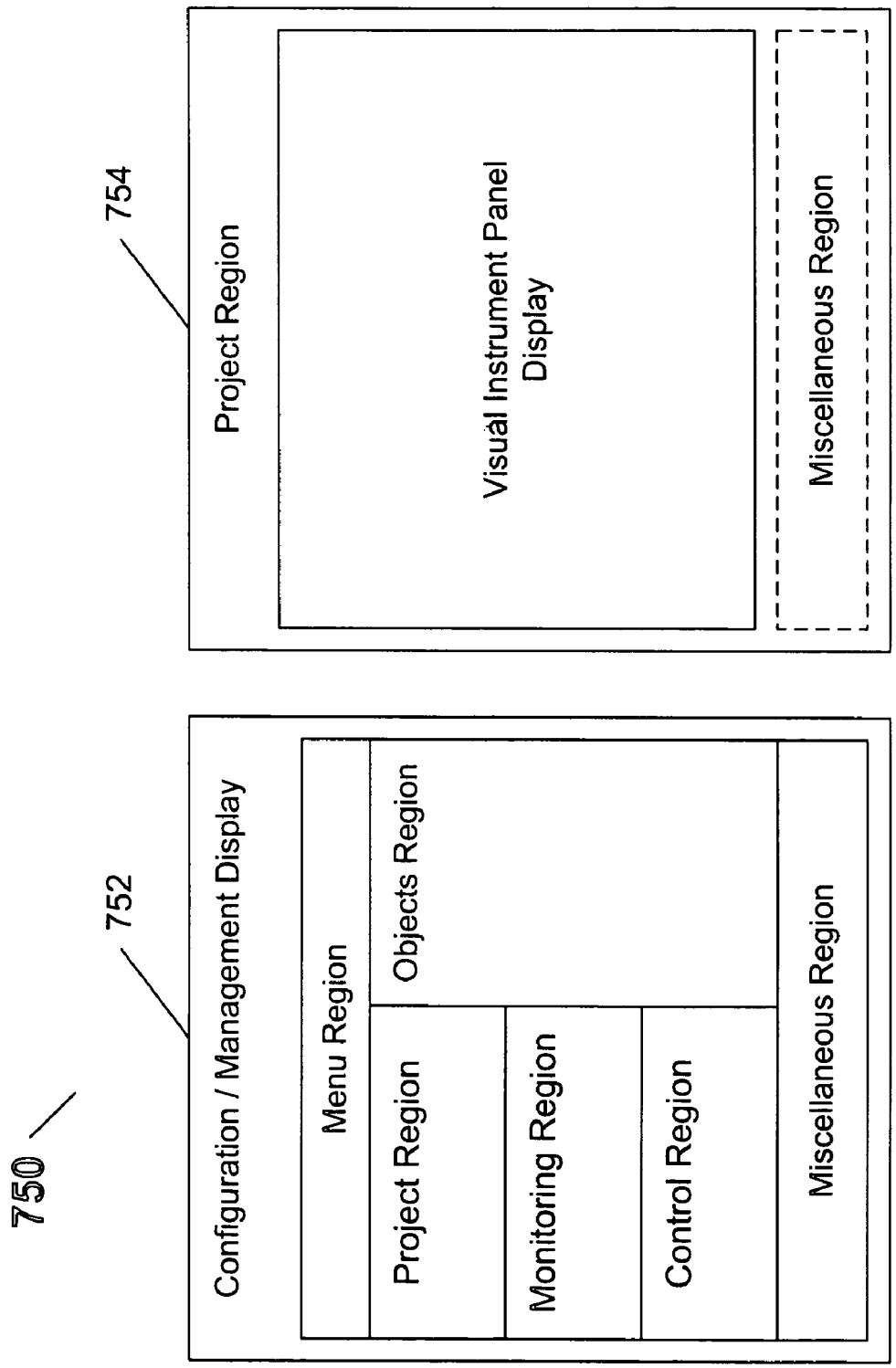

Referring now to FIG. 25, an exemplary VI_Panel 850 that may have been configured from the CMV_Set 550 of FIG. 16, or the IV_Diagram 600 of FIG. 17, utilizing any of the interfaces shown in FIGS. 22 to 24, or using any other GUI, is shown. The exemplary VI_Panel illustrates possible arrangements of the various ATSM_OBJECTs and ATSC_OBJECTs. For example, the objects that relate to the facility automation control are grouped apart from the conveyor-related objects, while "Alert" Indicator and Input objects are positioned proximal to one another so that they may be more efficiently utilized.

Returning now to FIG. 12, it should be noted that, in accordance with the present invention, the process 400 does not need to be performed from beginning to end in one session or even by a single user. For example, the user may end the process at the step 418 after designing the desired visual instrument panel, and optionally transmit data representative of the panel to another user at a remote user device (e.g., from user device 42 to user device 56 of FIG. 2) to enable that user to utilize the visual panel to selectively perform other steps of the process 400 to monitor/manage a desired target system (e.g., target system 60). For that reason steps 420 to 428 are shown as optional in FIG. 12. Assuming that the user wishes to begin using the visual instrument panel (or panels) that has been built at the step 418, at a step 420, the user device 12 connects to the appropriate target system (or systems) to enable the user to begin utilizing the visual instrument panel to monitor and/or manage the target system(s).

At an optional step 422, the user may select desired settings to record any and all aspects of the monitoring/management session (for example all or some of the data received from the target system, all or specific control signals sent to the target system, performance metrics, logs and alerts from the data handling system, an entire or partial record of the user's monitoring/management session, or any other information related to the operation of the target system(s) or the IRMM system 10. The user may also specify particular locations for all or part of the recorded data. Optionally, instead of being defined at the step 420, specific TSC or TSM_OBJECTs may be supplied with controllable parameters that enable the user to selectively use those objects to record particular data items or to even specify where the data is to be recorded (e.g., at the user device 12 or at some remote system, for example, a data repository).

At a step 424, the user initiates the target system monitoring/management session, and if specified at the step 422, at a step 426, the process 400 initiates selective recordings as previously specified, while the user performs a step 428 by monitoring ATSM_OBJECTs and/or selectively interacting with the ATSC_OBJECTs. When the session is complete, the process 400 ends at a step 430, where, if at least some aspects of the session and/or the target system were recorded at the step 426, the user may optionally be provided with one or more session/target system reports.

In conclusion, the IRMM system 10 of the present invention enables users to quickly and easily design one or more visual instrument panel GUIs to monitor/manage one or more target systems of any type, and to do so in real-time without any loss of data. Yet another advantage of the present invention is the ease with which the user can always modify a previously created visual instrument panel GUI to account for changes in the target system or in the monitoring/management requirements.

Thus, while there have been shown and described and pointed out fundamental novel features of the invention as applied to preferred embodiments thereof, it will be understood that various omissions and substitutions and changes in the form and details of the devices and methods illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A data processing system for interaction, by a user, with a predetermined task performance system having a plurality of components, when supplied with a data record representative of a plurality of attributes corresponding to at least a portion of the plural components, each plural attribute being representative of at least one component activity, and a component contact instruction, the data processing system comprising:

list means, for selectively generating a visual activity list comprising at least one plural attribute;

providing means, for providing at least one visual object, in a visual object list, each said visual object comprising a visual representation of a predefined desired interaction with at least a portion of the task performance system, and further comprising means for engaging in said desired interaction with a particular component of the plural components;

display means, for displaying, to the user, said visual activity list and said visual object list;

linking means, for linking each said plural attribute from said visual activity list to a particular visual object selected from said visual object list in accordance with:
at least one component activity, corresponding to each said plural attribute, and
said predefined desired interaction of said particular visual object;

activation means, for activating each said linked visual object by providing the component contact instruction from said linked plural attribute thereto, visual interaction means for enabling the user to selectively cause at least one plural component to engage in said at least one component activity by interactively manipulating at least one said plural active visual object linked thereto; and design means, for selectively displaying and arranging said plural active objects to construct a visual instrument panel that enables the user to interact with the task performance system through interactive manipulation of at least one of said plural active visual objects.

2. The data processing system of claim 1, wherein at least one of said plural components is operable to output at least one of: generated and acquired data, and at least one of said plural components is operable to perform at least one action, and wherein said predefined desired interaction between the user and the task performance system, comprises at least one of: monitoring at least one data output of the at least one plural component, and causing at least one plural component to perform at least one action.

3. The data processing system of claim 2, wherein said at least one action comprises one of: changing at least one operating parameter of the at least one plural component, causing the at least one plural component to transmit a data output to at least one active visual object, and causing the at least one plural component to perform at least one function.

4. The data processing system of claim 3, further comprising:

a data processing device operable to:
interactively display said visual instrument panel to an operator,
communicate with the task performance system; and
in response to a requested interaction, selectively transmit signals to the task performance system to cause at least one plural component to engage in said at least one component activity, and, when said at least one component activity comprises data output, to receive and direct said data output to at least one designated plural active visual object, and selectively record said data output.

5. The data processing system of claim 4, further comprising a real-time data handling system connected between said data processing device and the task performance system, operable to manage substantially real-time transmission of said data output from the task performance system to said data processing device while substantially eliminating undesirable interruption thereof.

6. The data processing system of claim 1, wherein the task performance system comprises a plurality of additional task performance systems, further comprising:

first control means for selectively activating and controlling, for each plural task performance system, said list means, said providing means, said display means, said linking means, said activation means, and said design means, to construct a master visual instrument panel having a plurality of regions, wherein each plural region comprises a plurality of active visual objects corresponding to a particular plural task performance system, to therefore enable interaction, by the user, with plural task performance systems.

for each said plural task performance system, to thereby enable selective interaction, by at least one operator, with plural task performance systems.

7. The data processing system of claim 1, wherein the user comprises a plurality of users, further comprising:

second control means, for separating said visual instrument panel into a plurality of sub-regions, wherein each plural sub-region comprises at least one plural active visual object corresponding to at least one plural component of the task performance system; and means for interactively displaying at least one plural sub-region to a corresponding predetermined plural user, to therefore enable each said predetermined plural user to collaborate with other predetermined plural users in interaction with the task performance system.

8. A data processing system for enabling a user to monitor and/or manage a predetermined task performance system connected thereto by a communication link, the predetermined task performance system having at least one component, comprising:

means for providing a data record representative of at least one attribute, each corresponding to a particular predefined component of at least one component, to be at least one of: monitored and managed by the user, each said at least one attribute comprising a component contact instruction and at least one component activity;

at least one interactive system operable to:
  assign a unique visual identification element to each of the at least one attribute, to visually represent each of the at least one attribute to the user,
  display said at least one visual identification element to the user;
  provide, and display to the user, at least one visual object, each comprising a visual interface for desired predefined interaction, by the user, with one or more of the at least one component;
  enable the user to selectively assign one or more of said at least one visual identification element to one or more of the corresponding at least one visual object; and
  generate at least one interactive visual object from each said at least one assigned visual object by providing said component contact instruction thereto, from the at least one attribute corresponding to the at least one visual identification element assigned thereto, wherein each said at least one interactive visual object is operable by the user to achieve said desired predefined interaction with a corresponding said at least one component.

9. The data processing system of claim 8, wherein said at least one interactive system is further operable to:
  enable the user to form a desired visual instrument panel by enabling the user to visually arrange said at least one interactive visual object, such that, the user is able to at least one of: monitor and manage the predetermined task performance system, by selectively interacting with each of said at least of interactive visual object in said visual instrument panel.

10. The data processing system of claim 8, wherein said at least one interactive system is further operable to:
  establish communication with the predefined task performance system through the communication link;
  define a session representative of a plurality of operations during a desired period of interaction between the user, utilizing at least one of said interactive visual objects, and the predefined task performance system; and
  in accordance with predetermined session settings selectively record at least a portion of said plurality of operations.

11. The data processing system of claim 10, wherein each said plural operation is representative of at least one of: sending at least one control command to at least one component to cause the at least one component to perform at least one action, and, when a particular component outputs at least one of: generated and acquired data, receiving, monitoring, and displaying, to the user, said output data.

12. The data processing system of claim 8, wherein when said data record is located at a remote system, said means for providing said data record, comprises retrieving means for retrieving said data record from said remote system.

13. The data processing system of claim 8, wherein, a virtual system model representative of the task performance system and of the at least one component thereof is provided to said at least one interactive system, and wherein said means for providing said data record, comprises data processing means for generating at least a portion of said data record from said virtual system model.

14. A data processing method for enabling at least one user to interact with a predetermined task performance system having a plurality of components, when supplied with a data record representative of a plurality of attributes corresponding to at least a portion of the plural components, each plural attribute being representative of at least one component activity, and a component contact instruction, the data processing method comprising the steps of:
  (a) selectively generating a visual activity list comprising at least one plural attribute;
  (b) providing at least one visual object, in a visual object list, each said visual object comprising a visual representation of a predefined desired interaction with at least a portion of the task performance system, and being operable to engage in said desired interaction with a particular plural component;
  (c) displaying, to the at least one user, said visual activity list and said visual object list;
  (d) linking each said plural attribute from said visual activity list to a particular visual object selected from said visual object list in accordance with (1) at least one component activity, corresponding to each said plural attribute, and (2) said predefined desired interaction of said particular visual object;
  (e) activating each said linked visual object by providing the component contact instruction, from said linked plural attribute, thereto, thus generating a corresponding at least one active visual object;
  (f) enabling the at least one user to selectively cause at least one plural component to engage in said at least one component activity, by interactive manipulation of said corresponding at least one said active visual object linked thereto; and
  (g) enabling the at least one user to selectively display and arrange said at least one active visual object to construct a visual instrument panel that enables the at least one user to interact with the task performance system through said interactive manipulation of said at least one active visual objects.

15. The data processing method of claim 14, wherein, at least one of said plural components is operable to output at least one of: generated and acquired data, and wherein said predefined desired interaction between the at least one and the task performance system, comprises the step of:
  (h) monitoring, by the at least one user utilizing at least one of said plural active visual objects, at least a portion of said data output of the at least one plural component.

16. The data processing method of claim 15, further comprising the step of:
  (u) managing substantially real-time transmission of said data output from the task performance system to said at least one plural active visual object, while substantially eliminating undesirable interruption thereof.

17. The data processing method of claim 14, wherein, at least one of said plural components is operable to perform at least one action, and wherein said predefined desired interaction between the at least one user and the task performance system, comprises the step of:
  (i) causing at least one plural component to perform said at least one action.

18. The data processing method of claim 17, wherein said at least one action comprises at least one of the following steps:
  (j) changing at least one operating parameter of the at least one plural component,
  (k) causing the at least one plural component to transmit data to at least one specific active visual object, and (l) causing the at least one plural component to perform at least one predetermined function.

19. The data processing method of claim 14, further comprising the steps of:
(m) interactively displaying said interactive visual panel to an operator of an interactive data processing system;
(n) establishing communication between said interactive data processing system and the task performance system through a communication link therebetween;
(o) causing at least one plural component to engage in at least one component activity, in response to an interaction request from said operator, by selectively transmitting at least one control signal to the task performance system through the communication link, and
(p) when the at least one component activity comprises output of data that has been at least one of: acquired and generated, by said at least one acting plural component, receiving and directing said data output to at least one designated active visual object.

20. The data processing method of claim 19, wherein said step (p) further comprises the step of:
(q) selectively recording at least a portion of said data output.

21. The data processing method of claim 19, wherein the task performance system comprises a plurality of additional task performance systems, further comprising the step of:
(r) building a master visual instrument panel having a plurality of regions, wherein each plural region comprises a plurality of active visual objects corresponding to a particular plural task performance system, by selectively performing at least a portion of said steps (a) to (g) for each said plural task performance system, to thereby enable selective interaction, by said at least one operator, with said plural task performance systems.

22. The data processing method of claim 19, wherein the at least one user comprises a plurality of users, further comprising the steps of:
(s) separating said visual instrument panel into a plurality of sub-regions, wherein each plural sub-region comprises at least one plural active visual object corresponding to at least one plural component of the task performance system; and
(t) interactively displaying at least one said plural sub-region to a corresponding predetermined plural user, to therefore enable each said predetermined plural user to collaborate with other predetermined plural users in interaction with the task performance system.

23. A data processing method for enabling at least one user to monitor and/or manage a predetermined task performance system connected thereto by a communication link, the predetermined task performance system having at least one component, comprising the steps of:
(a) providing a data record representative of at least one attribute, each corresponding to a particular predefined component of the at least one component, to be at least one of: monitored and managed by the at least one user, each said at least one attribute comprising a component contact instruction and at least one component activity;
(b) assigning a unique visual identification element to each of the at least one attribute, to visually represent each of the at least one attribute to the at least one user;
(c) displaying said at least one visual identification element to the at least one user;
(d) providing and displaying to the at least one user, at least one visual object, each said at least one visual object comprising a visual interface for desired predefined interaction, by the user, with one or more of the at least one component;
(e) selectively assigning one or more of said at least one visual identification element to one or more of the corresponding at least one visual object; and
(f) generating at least one interactive visual object from each said at least one assigned visual object by providing said component contact instruction thereto, from the at least one attribute corresponding to the at least one visual identification element assigned thereto.

24. The data processing method of claim 23, further comprising the step of:
(g) selectively manipulating said at least one interactive visual object by the at least one user, to achieve said desired predefined interaction with a corresponding at least one component.

25. The data processing method of claim 24, further comprising the step of:
(h) building a desired visual instrument panel by the at least one user to visually arrange said at least one interactive visual object to optimize at least one of: monitoring and management of the predetermined task performance system.

26. The data processing method of claim 25, further comprising the steps of:
(u) prior to said step (h), providing, to the at least one user, an interactive graphical interface comprising a first display region for displaying, to the at least one user, said at least one visual identification element, a second display region for displaying, to the at least one user, said at least one interactive visual object, and a third display region for building, by the at least one user, said desired visual instrument panel.

27. The data processing method of claim 25, further comprising the step of:
(i) monitoring, by the at least one user utilizing said visual instrument panel, of the predetermined task performance system, by selectively interacting with each of said at least one interactive visual object in said visual instrument panel.

28. The data processing method of claim 25, further comprising the step of:
(j) managing, by the at least one user utilizing said visual instrument panel, of the predetermined task performance system, by selectively interacting with each of said at least one interactive visual object in said visual instrument panel.

29. The data processing method of claim 23, further comprising the steps of:
(k) defining a session representative of a plurality of operations during a desired period of interaction between the at least one user, utilizing at least one said interactive visual object, and the predefined task performance system; and
(l) in accordance with predetermined session settings, selectively recording at least a portion of said plurality of operations.

30. The data processing method of claim 29, further comprising the step of:
(m) prior to said step (k), defining said predetermined session settings.

31. The data processing method of claim 29, wherein each said plural operation comprises at least one of the following steps:

(n) sending at least one control command to at least one component, to cause the at least one component to perform at least one action; and (o) when a particular component outputs at least one of: generated and acquired data, at least one of the following steps:

(p) monitoring said output data, (q) receiving said output data, and (r) displaying said output data to the at least one user.

32. The data processing method of claim 23, wherein when said data record is located at a remote system, said step (a) comprises the step of:

(s) retrieving said data record from said remote system.

33. The data processing method of claim 23, wherein said step (a) comprises the steps of:

(t) providing a virtual system model representative of the predetermined task performance system, and of the at least one component thereof, and (u) generating at least a portion of said data record from said virtual system model.

34. The data processing method of claim 23, wherein said data record comprises at least a portion of the following information: information relating to and identifying the predetermined task performance system, instructions for connection and interfacing with the predetermined task performance system, and information relating to said at least one attribute and to said corresponding component contact instruction and at least one component activity thereof.

35. The data processing method of claim 23, wherein said at least one visual identification element comprises a plurality of visual identification elements, and wherein said step (c) comprises the steps of:

(v) arranging said plural visual identification elements in a visual element set having a predetermined interactive format configured for optimizing the selection of said plural visual identification elements therefrom; and (t) displaying said visual element set to the at least one user.

36. The data processing method of claim 35, wherein said predetermined interactive format comprises at least one of: a tree structure, a scrolling menu structure, a collapsible tree structure, and a drop-down menu structure.

* * * * *